(12) United States Patent
Crippa et al.

(10) Patent No.: US 7,499,332 B2
(45) Date of Patent: Mar. 3, 2009

(54) CIRCUIT AND METHOD FOR ELECTRICALLY PROGRAMMING A NON-VOLATILE SEMICONDUCTOR MEMORY VIA AN ADDITIONAL PROGRAMMING PULSE AFTER VERIFICATION

(76) Inventors: Luca Crippa, Via Manzoni, 66, Busnago (IT) 20040; Rino Micheloni, Vai Luini, 11, Turate (IT) 22078

( * ) Notice: Subject to any disclaimer, the term of this patent is extended or adjusted under 35 U.S.C. 154(b) by 60 days.

(21) Appl. No.: 11/766,493

(22) Filed: Jun. 21, 2007

(65) Prior Publication Data
US 2008/0013378 A1    Jan. 17, 2008

(30) Foreign Application Priority Data
Jun. 21, 2006    (EP) .................................. 06115812

(51) Int. Cl.
*G11C 16/34* (2006.01)
(52) U.S. Cl. ............................ 365/185.22; 365/185.17; 365/185.19; 365/185.12; 365/185.03
(58) Field of Classification Search ............ 365/185.02, 365/185.03, 185.09, 185.22, 185.17, 185.19, 365/185.12
See application file for complete search history.

(56) References Cited

U.S. PATENT DOCUMENTS

| | | | | |
|---|---|---|---|---|
| 6,937,520 B2* | 8/2005 | Ono et al. | ............... | 365/185.18 |
| 6,992,931 B2* | 1/2006 | Pekny | ..................... | 365/185.2 |
| 2008/0084752 A1* | 4/2008 | Li et al. | ................. | 365/185.19 |

* cited by examiner

*Primary Examiner*—Andrew Q Tran
(74) *Attorney, Agent, or Firm*—Blakely, Sokoloff, Taylor & Zafman LLP

(57) ABSTRACT

A method of electrically programming a memory cell includes: applying at least one electrical programming pulse to the memory cell; verifying the reaching of a target programming state by the memory cell; and repeating the acts of applying and verifying until the reaching of a target programming state by the memory cell is assessed. After the reaching of a target programming state by the memory cells is assessed, at least one further electrical programming pulse is applied thereto, and the memory cell is verified at least one more time after applying the further programming pulse. In case, as a result of said further verifying, the reaching of the target programming state by the memory cell is not assessed, the method provides for applying a still further programming pulse to the memory cell.

18 Claims, 11 Drawing Sheets

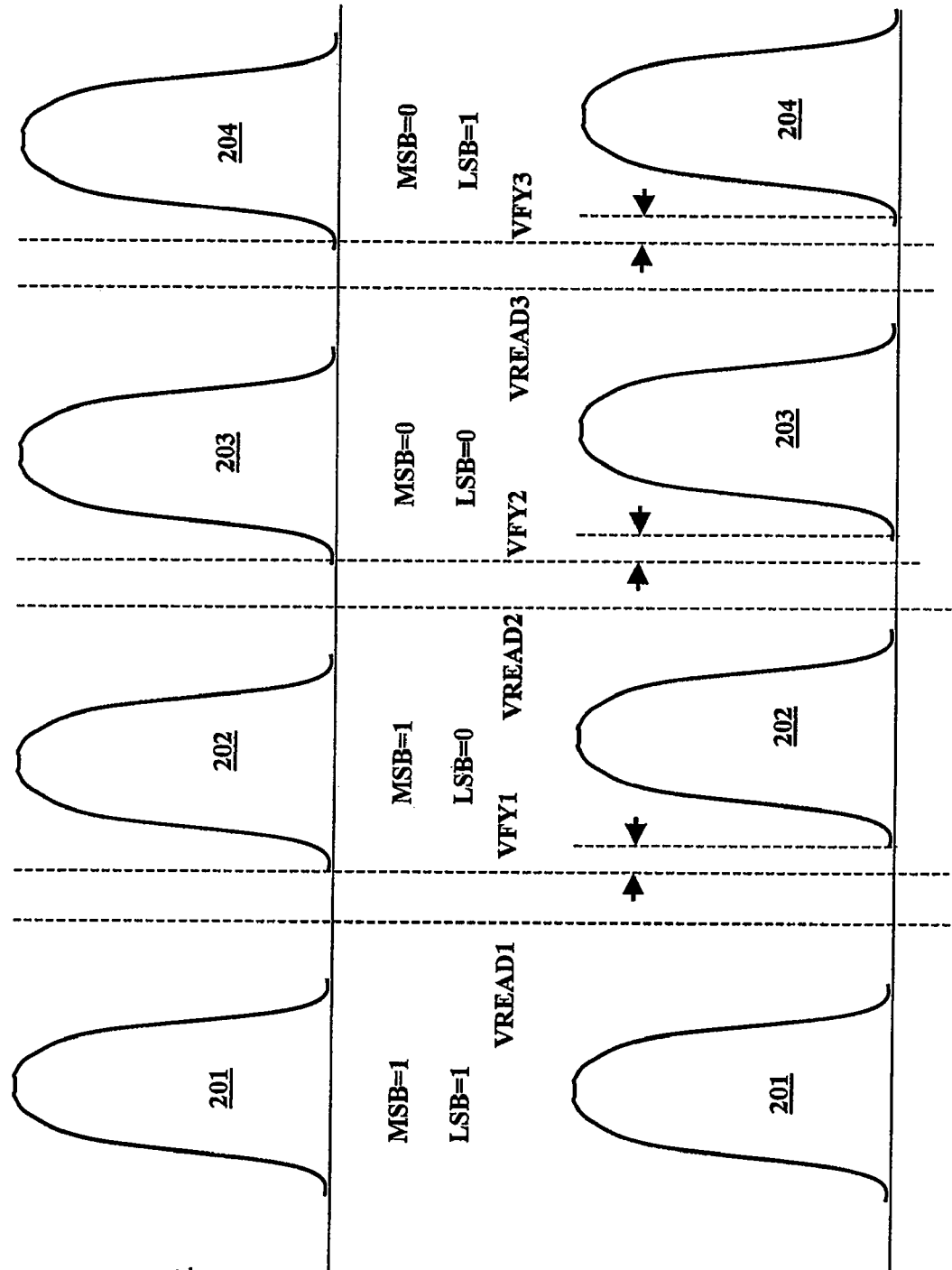

CIRCUIT AND METHOD FOR ELECTRICALLY PROGRAMMING A NON-VOLATILE SEMICONDUCTOR MEMORY VIA AN ADDITIONAL PROGRAMMING PULSE AFTER VERIFICATION

BACKGROUND

1. Technical Field

The present invention generally relates to the field of solid-state memories, particularly to semiconductor memories and, even more particularly, to non-volatile semiconductor memories. Specifically, the invention relates to the class of non-volatile memories that are electrically programmable, i.e., the information content of which can be altered electrically.

2. Description of the Related Art

Non-volatile memory devices (shortly, non-volatile memories) are commonly used in several applications, when it is needed or desired that the data stored in the memory device are preserved even in absence of power supply.

Within the class of non-volatile memories, electrically alterable memories, particularly electrically programmable and erasable memories, such as Flash memories, have become very popular in those applications where the data to be stored are not immutable, being instead desirable from time to time to store new data, or to update the data previously stored (on the contrary, a consolidated microcode for a microprocessor is an example of data that are not expected to be changed).

Most electrically-programmable, non-volatile memories, like Flash memories, have memory cells formed of or including MOS transistors with a charge-storage element in the form of a floating-gate electrode, wherein to electric charges can be injected in order to vary a threshold voltage of the MOS transistor.

Typically, a semiconductor memory device includes a plurality of semiconductor memory cells, arranged for example in rows and columns so as to form a matrix of memory cells ("memory matrix").

Depending on the way the memory cells in the memory matrix are interconnected, two classes of Flash memories can be identified: those having a so-called NOR architecture, or NOR Flash memories, and those having a so-called NAND architecture, shortly referred to as NAND Flash memories. Roughly speaking, in a NOR architecture the memory cells of a same matrix column are connected in parallel to a same bit line, whereas in a NAND architecture groups of memory cells of a same matrix column are serially interconnected so as to form respective strings (sometimes also referred to as "stacks"); several strings are connected, in parallel to each other, to a same bit line. Compared to NOR Flash memories, NAND Flash memories are more compact (a lower number of electrical contacts in the memory matrix), and they are also better suited for applications such as storage of files like digital images.

In memories having the NOR architecture, sense amplifiers are provided for sensing, i.e., reading the content of the memory cells, whereas program load circuits are used to program, i.e., write the information into the memory cells. Typically, eight or sixteen sense amplifiers, and as many program load circuits are provided in a memory, to enable sensing, and programming eight or sixteen memory cells in parallel.

In memories having the NAND architecture, the memory space is ideally partitioned into a plurality of memory pages, each page corresponding to a group of memory cells that, in operation, are accessed, i.e., read or written, simultaneously, i.e., in parallel to each other. The number of memory cells in each group determines the size (i.e., the number of bits) of the memory page. Memory pages of 8,192 (8K) cells are rather typical, but larger memory pages are also encountered, for example of 16,384 (16K) cells. A circuit arrangement referred to as "page buffer" is typically provided in a NAND flash memory for managing the operations of reading the information stored in the memory cells of a selected memory page, or altering the content of the memory page, particularly writing new information thereinto. In very general terms, the page buffer includes a buffer register wherein data read (in parallel) from the memory cells of a selected page are temporarily stored, before being serially outputted in chunks of, e.g., eight or sixteen bits, depending on the number of I/O terminals of the memory; similarly, when data are to be written into the memory, the page buffer is replenished with data received serially in said eight- or sixteen-bits chunks, and, after the page buffer has eventually been filled, the data are written in parallel into the memory cells of a selected memory page.

Memory devices are also classified based on the amount of information storable per memory cell. Memory devices capable of storing two bits of information per memory cell are referred to as "two-level" memories, whereas memory devices capable of storing more than just two information bits per memory cell are referred to as "multi-level" memories. Usually, the programming state of a memory cell is defined by the threshold voltage value of a MOS transistor included in the memory cell. In a two-level memory, each memory cell can be programmed in one of two distinct programming states, corresponding to two values (or values within two different ranges of values) of the threshold voltage of the MOS transistor of the memory cell. In particular, four-level memories are known, whose memory cells can be programmed in any one of four different programming states, each one associated with a corresponding logic value of the couple of bits they are adapted to store. In a memory cell adapted to store two bits, the threshold voltage values of the MOS transistor included in the generic memory cell may take one of four different values (or values within four different ranges of values).

Programming selected memory cells typically calls for applying to the memory cells to be programmed a sequence of programming pulses, wherein each programming pulse involves applying to the memory cells to be programmed predetermined biasing voltages (programming voltages) for a prescribed time. The data to be written into the memory cells (or corresponding data) are firstly latched into volatile latch elements provided in the program load circuits or in the page buffers; the latched data determine whether or not the memory cells have to receive the programming pulse.

Typically, after each programming pulse, the selected memory cells are read to assess whether they have reached the target programming state. As soon as a memory cell is verified as programmed to the target programming state, the information that was previously latched in the respective latch element (part of the program load circuits or of the page buffer) and that determined whether or not that cell should receive programming pulses is lost. The memory cell is applied no further programming pulses, and it is no longer subjected to any verify operation of its programming state: in other words, the successfully verified memory cell is permanently excluded from, i.e., it is permanently (as far as the considered program operation is concerned) prevented from being applied further programming pulses.

BRIEF SUMMARY OF THE INVENTION

The Applicant has observed that the way the program operation is usually conducted may cause problems. In particular, the Applicant has observed that problems may arise from the fact that a memory cell, immediately after having been verified as correctly programmed to the target programming state, is permanently excluded from being applied further programming pulses, and its programming state is no longer verified.

Indeed, stopping applying further programming pulses and verifying a memory cell right after the first successful verify operation on that cell impose that a sufficiently high security margin is guaranteed compared to a normal read operation: should a memory cell be declared as programmed to the target programming state the first time it is assessed as programmed by means of a reading in the same conditions as a normal reading, that memory cell most probably would, in a normal read operation, be assessed as not programmed, due to the inevitable differences in biasing conditions experienced in two situations. For this reason, the program verify operation is performed using memory cell's biasing conditions that are deliberately worse, i.e., more critical compared to the normal read biasing conditions: for example, the voltage applied to the word line containing the memory cell to be verified is higher in the program verify operation than in the normal read operation, and/or the memory cell current is compared to a different reference current. This has the disadvantage that different reference voltages/currents need to be generated within the memory device for the use in a normal read operation and for the use in a program verify operation. The number of different reference voltages/currents that need to be generated increases with the increase in the number of different programming states admissible for the memory cell. Having to generate several reference current/voltages is disadvantageous, because several reference circuit structures need to be integrated and trimmed, e.g., during the memory device testing. This increases the costs.

Also, dispensing a memory cell from being subjected to further verify operations right after it has been verified as programmed to the target state is risky: due to the change in biasing conditions that inevitably takes place due to the programming of the remaining memory cells, that memory cell, initially verified as correctly programmed, might, at a later time, e.g., after completion of the programming operation on the remaining memory cells, be seen as not programmed. If this occurs, the functioning of the memory device is impaired, because incorrect data are stored therein.

In view of the state of the art outlined in the foregoing, the Applicant has faced the problem of how to improve the known programming methods so as to overcome the above-mentioned problems.

One embodiment of the present invention is a method of electrically programming a memory cell.

The method comprises:
applying to the memory cell at least one electrical programming pulse;
verifying the reaching of a target programming state by the memory cell; and
repeating said applying and verifying until the reaching of a target programming state by the memory cell is assessed.

After the reaching of a target programming state by the memory cells is assessed, at least one further electrical programming pulse is applied to the memory cell, and the reaching of a target programming state is verified at least one more time after applying the further programming pulse. In case, as a result of said further verify, the reaching of the target programming state by the memory cell is not assessed, the method provides for applying a still further programming pulse to the memory cell.

Thus, the method programs memory cells, particularly non-volatile memory cells, which, differently from the conventional programming methods, does not inhibit the execution of program verify operations on memory cells that have already been assessed to have reached the target programming state: every memory cell in a group of memory cells under programming continues to be subject to program verify operations, until all the memory cells are assessed as programmed to the respective target programming state, and the program operation is completed.

In particular, the first time a memory cell being programmed is verified as programmed to the target programming state, an extra programming pulse is always applied thereto; afterwards, provided the memory cell continues to be verified as programmed to the target programming state, it is excluded from the application of further programming pulses; however, if in the course of the programming operation the memory cell happens to be not verified as programmed, it is again applied programming pulses.

The application of the extra programming pulse to each memory cell being programmed right after the memory cell is verified as having reached the target programming state ensures that the memory cell is programmed with a sufficient security margin, so that it is very unlikely that, in the prosecution of the programming operation, that memory cell may not pass the program verify.

According to another embodiment of the present invention, a circuit for programming an electrically-programmable memory cell is provided.

BRIEF DESCRIPTION OF THE SEVERAL VIEWS OF THE DRAWINGS

The features and advantages of the present invention will be best understood by reading the following detailed description of some embodiments thereof, provided merely by way of non-limitative example, to be read in conjunction with the accompanying drawings, wherein:

FIG. 2 is simplified view of conventional statistical distributions of threshold voltages of the memory cells of a four-level memory;

FIG. 5 shows the statistical distributions of the threshold voltages of the memory cells of a four-level memory device obtained from programming the cells by means of the programming method of FIG. 4;

DETAILED DESCRIPTION

Figure 1:
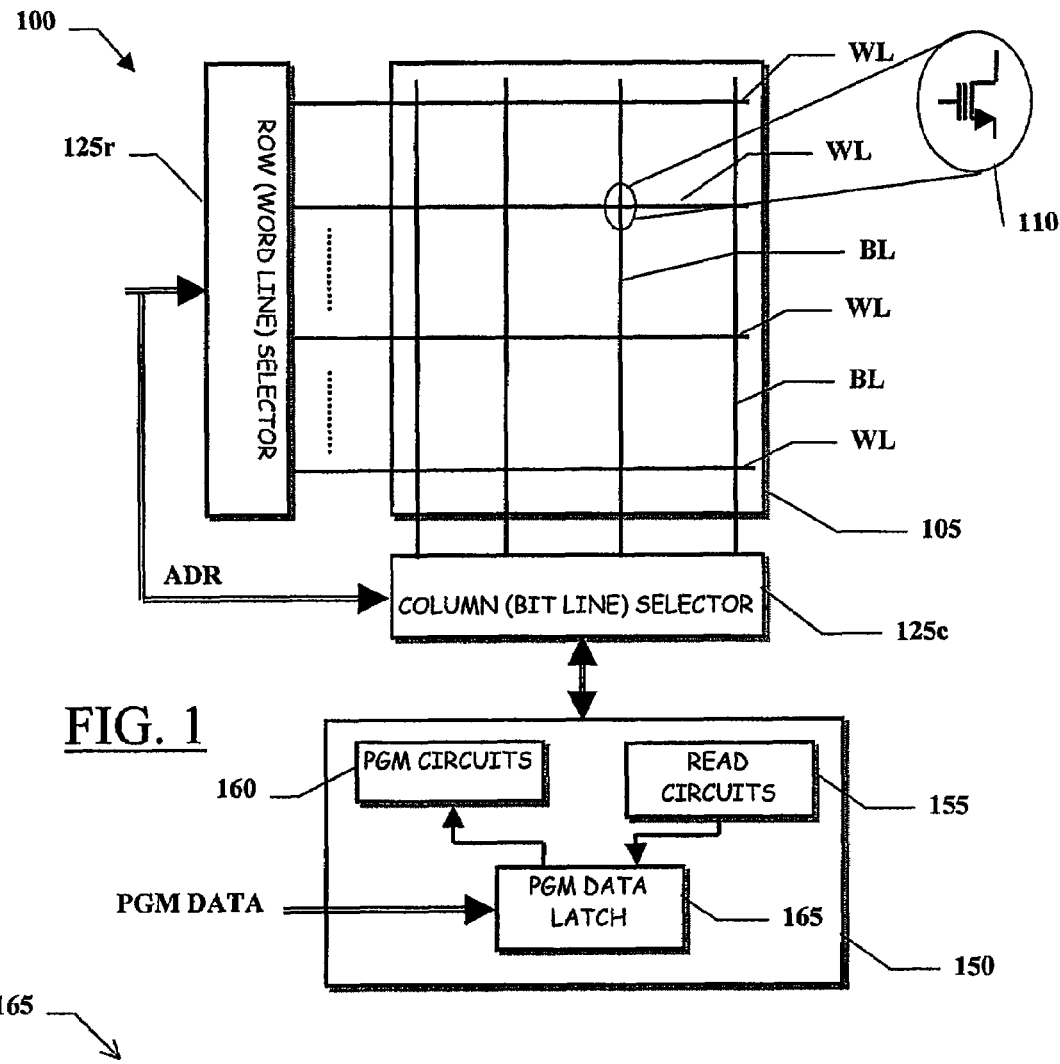
FIG. 1 is a schematic view, in terms of the main functional blocks, of an electrically programmable semiconductor memory wherein the present invention can be advantageously applied.

With reference to the drawings, in FIG. 1 a non-volatile semiconductor memory, globally identified as 100, is schematically illustrated in terms of the main functional blocks; in particular, the memory 100 is an electrically-programmable, non-volatile semiconductor memory, for example a flash memory.

The flash memory 100 is integrated in a chip of semiconductor material, and includes a plurality of memory cells 110 adapted to store data; the memory cells 110 are arranged in a plurality of rows and a plurality of columns, and form a two-dimensional memory matrix 105.

Typically, each memory cell 110 consists of or includes an N-channel MOS transistor having a charge-storage element, such as a conductive, electrically-insulated floating-gate electrode adapted to be charged by electrons.

The flash memory 100, and particularly the memory matrix 105 may either have a NOR architecture or a NAND architecture, the specific architecture of the flash memory 100 being per-se not a limitative aspect of the present invention. In the following description, a discussion will first be provided intended to present an embodiment of the present invention in general terms, valid in principle for both a NOR memory and a NAND memory; afterwards, a detailed description of an invention embodiment specific for a NAND memory will be presented.

The flash memory 100 may be a multi-level memory; e.g., a four-level memory, wherein each memory cell 110 is adapted to store a two-bit binary value, comprised of a Least Significant Bit (LSB) and a Most Significant Bit (MSB). However, it is pointed out that the number of bits storable by the generic memory cell 110 of the memory 100 is not per-se a limitative aspect of the present invention, which applies also to two-level memories, as well as to higher-level memories, i.e., whose memory cells are adapted to store more than two bits.

As known to those skilled in the art, in an erased condition (in the context of the present description, the erased condition is regarded as a first programming state, associated with a first logic value), the generic memory cell 110 has a first, relatively low threshold voltage value. The four-level memory cell 110 can be programmed into any one of three further different programming states by causing predetermined amounts of electric charge to be injected into the floating-gate electrode thereof. Each of these further three programming states is characterized by a respective threshold voltage value (or by a respective range of threshold voltages values) higher than the threshold voltage value (or range of values) of the preceding programming state. Higher threshold voltage values correspond to increased amounts of electric charge injected into the floating-gate electrode. More particularly, a second programming state (associated with a second logic value), is characterized by a second threshold voltage value (or range of values) that is higher than the first threshold voltage value, but lower than a third threshold voltage value (or range of values) corresponding to a third programming state (associated with a third logic value). A fourth programming state (associated with a fourth logic value), is characterized by having the highest threshold voltage value (or range of values).

FIG. 2 shows conventional statistical distributions 201, 202, 203, 204 of threshold voltages of a population of four-level memory cells (like the memory cells of a memory matrix of a memory device) programmed to the four possible programming states. Reference numeral 201 identifies the statistical distribution of the threshold voltage values of the memory cells in the erased condition, i.e., of the cells belonging to the first programming state, associated, according to a possible convention, with the logic value "11" (MSB=1, LSB=1). Reference numeral 202 denotes the statistical distribution of the threshold voltage values of the memory cells programmed to the second programming state, associated, according to a possible convention, with the logic value "10" (MSB="1", LSB="0"); reference numeral 203 denotes the distribution of the threshold voltage values of the memory cells in the third programming state, associated, according to a possible convention, with the logic value "00" (MSB="0", LSB="0"); and reference numeral 204 identifies the distribution of the threshold voltage values of the memory cells in the fourth programming state, associated, according to a possible convention, with the logic value "01" (MSB="0", LSB="1"). The distributions are for example generically Gaussian in shape, and are each one centered around a center, mean threshold voltage value.

It is observed that, according to a different convention, it might be possible to associate the logic values "11", "10", "01" and "00" to increasing threshold voltage values, the logic value "11" being associated to the programming state having the lowest threshold voltage value (erased state), and the other logic values being associated in succession to programming states having increasing threshold voltage values. The correspondence between programming states (i.e., threshold voltage values) and values of the stored two-bit codes presented above is different, and exploits the Gray coding: according to the Gray coding, programming states that are adjacent (in terms of their distribution of threshold voltage values) correspond to stored logic values that differ from each other for only one bit (the two distributions 201 and 204 at the extremes are regarded as adjacent to one another). The adoption of the Gray coding may be advantageous in some application: as will be discussed in detail later on in the present description, the number of operations required for reading a memory cell's content may in some cases be reduced.

As schematically depicted in FIG. 1, the memory cells 110 are connected to word lines WL and bit lines BL. Word line selection circuits 125r and bit lines selection circuits 125c are provided for selecting the word lines and the bit lines, in order to access desired memory cells within the memory matrix 105; the selection is typically made on the basis of an address code ADR that the memory device may receive from the outside, e.g., from a microprocessor or a memory controller (not shown in the drawings), and that is supplied to both the word line selector 125r and the bit line selector 125c.

Also schematically shown in FIG. 1 is a functional block 150 intended to include circuits 155 for reading the data content of selected memory cells, and circuits 160 for programming, i.e., writing data into selected memory cells.

Memory cells are accessed for reading their content by applying prescribed biasing voltages (reading voltages) thereto, through the respective word line and bit line; generally, depending on the memory cell's threshold voltage value compared to the biasing voltages applied thereto, the memory cell will be conductive or not. In particular, in the exemplary case considered herein of four-level memory cells, the programming state of a generic memory cell may be fully discriminated by comparing the memory cell's threshold voltage to four read reference voltages VREAD1, VREAD2 and VREAD3, of values intermediate between the threshold voltage statistical distributions 201 and 202, 202 and 203 and 203 and 204, respectively.

In a Flash memory, memory cells are typically programmed by Fowler-Nordheim (F-N) tunneling of electrons into their floating-gate electrodes. A sequence of programming pulses is applied to the memory cells to be programmed, wherein each programming pulse involves applying to the memory cells to be programmed predetermined biasing voltages (programming voltages) for a prescribed time. The application of the generic programming pulse to a memory cell causes a slight increase (e.g., 200-300 mV) of the threshold voltage thereof.

The data to be programmed, denoted in the drawing by reference PGM DATA, received for example from outside the memory, e.g., from a microprocessor, are temporarily stored into a volatile storage register, comprising program data latches 165; the content of the program data latches 165 conditions the operation of the programming circuits 160; in particular, the content of the program data latches 165 determines whether or nor the memory cells have to receive the programming pulses.

After each programming pulse, a program verify operation is conducted: the memory cells are read (using the reading circuits 155) to assess whether they have reached the target programming state. In the exemplary case considered herein of four-level memory cells, the attainment of the target programming state by a generic memory cell may be assessed by comparing the memory cell's threshold voltage to three verify reference voltages VFY1, VFY2 and VFY3, conventionally of values corresponding approximately to a lower limit of the threshold voltage statistical distributions 202, 203 and 204, respectively. The result of the program verify operation affects the content of the program data latches.

Conventionally, as soon as a memory cell is verified as programmed to the target programming state, the data that were previously latched in the program data latches 165 and that determined whether or not that cell should receive programming pulses are lost; the memory cell is applied no further programming pulses, and it is no longer subjected to any verify operation: the successfully verified memory cell is thus permanently excluded from, i.e., it is permanently (as far as the considered program operation is concerned) inhibited the application of further programming pulses. As discussed in the foregoing, the Applicant considers this a possible source of problems.

Figure 3:
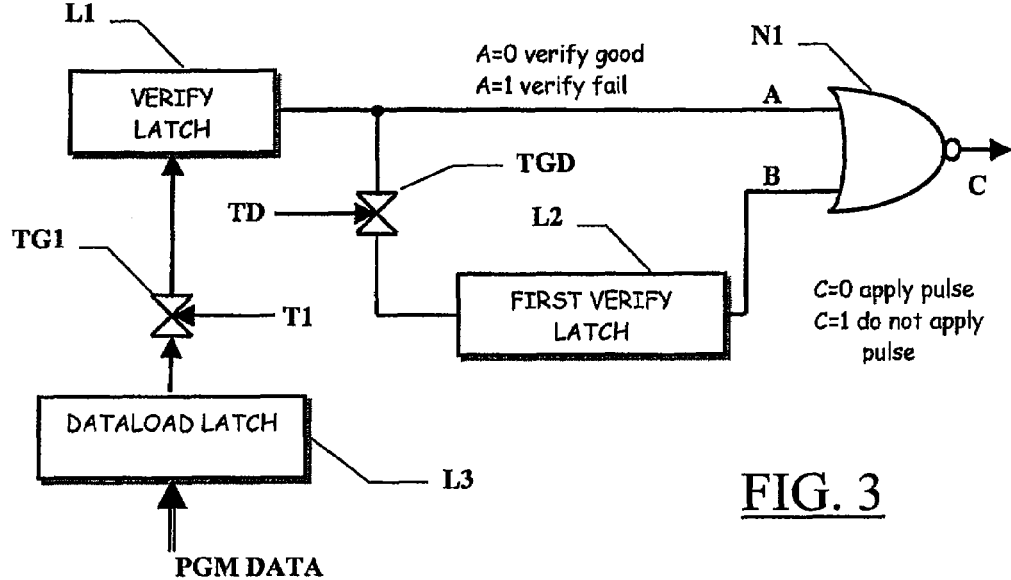
FIG. 3 schematically shows, in terms of functional blocks, a circuit for programming the memory cells of the memory of FIG. 1, according to an embodiment of the present invention.

In FIG. 3 there is schematically shown, in terms of functional blocks, a structure of the program data latches 165 according to an embodiment of the present invention, that is adapted to overcome the problem of permanent exclusion of a memory cell from being further verified rightly after it is verified as programmed to the target programming state.

As visible in FIG. 3, three latches L1, L2 and L3 are provided; the latch L3 (hereinafter also referred to as "dataload latch") is intended to receive and latch the program data PGM DATA. An output of the dataload latch L3 is connected, through a selectively activatable transfer gate TG1 controlled by a signal T1, to an input of the latch L1 (hereinafter also referred to as "verify latch"), which, depending on its content, conditions the operation of the programming circuits 160. An output of the verify latch L1 is connected, through a selectively activatable transfer gate TGD controlled by a signal T2, to an input of the latch L2 (hereinafter also referred to as "first verify latch"). The outputs of the verify latch L1 and of the first verify latch L2 are connected to a combinational circuitry that, based on the content of these two latches, determines whether or not a programming pulse is to be applied to the selected memory cell. In particular, the combinational circuitry may be a joint denial logic circuitry, schematized in the drawing as a NOR gate N1, receiving at a first input an output A of the verify latch L1, and, at a second input, an output B of the first verify latch L2. A state of the output C of the NOR gate N1 determines whether or not the selected memory cell has to receive a programming pulse; for example, if the NOR gate output C="0", the memory cell has to receive a programming pulse, whereas if C="1" no programming pulse has to be applied to the selected memory cell.

Figure 4:
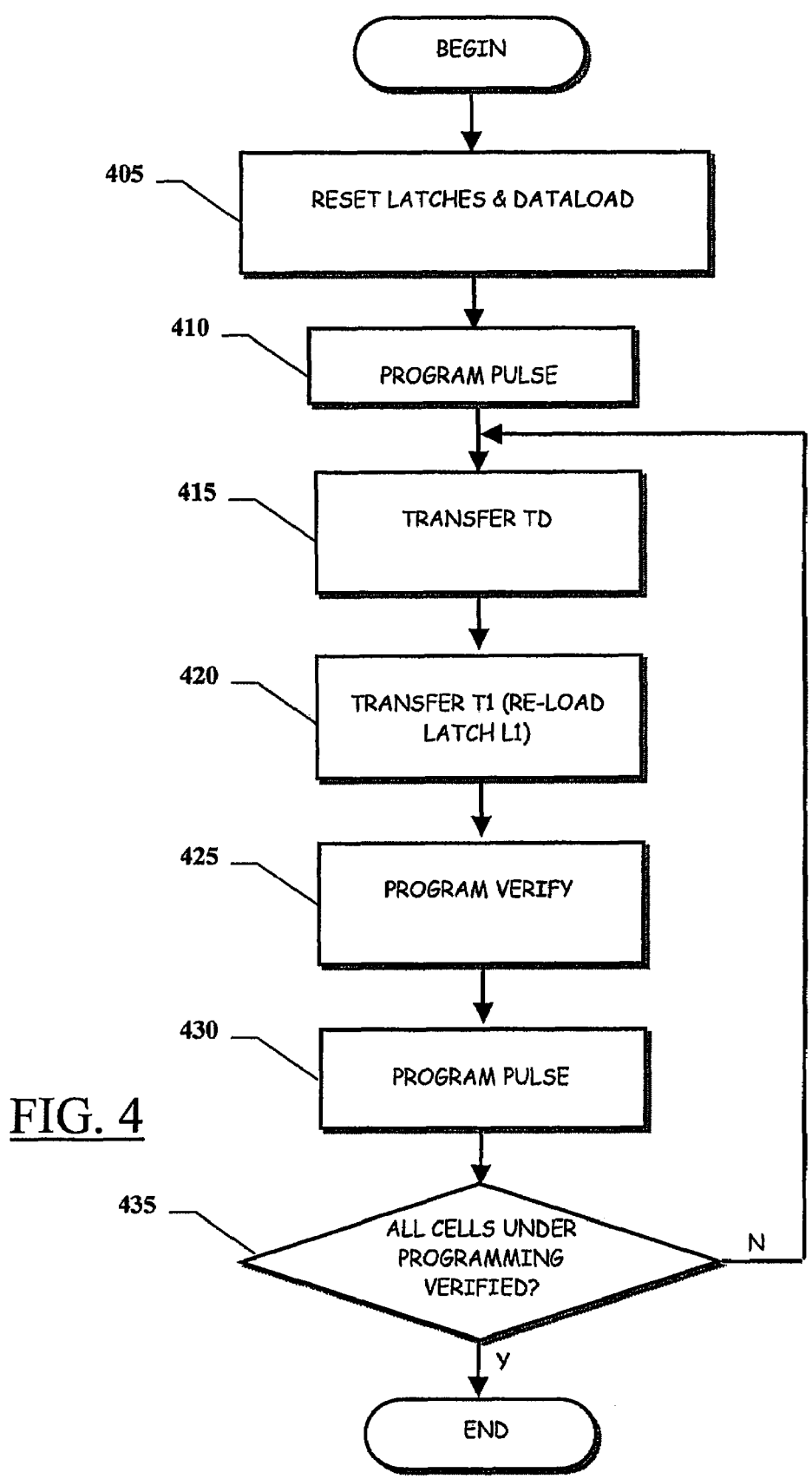
FIG. 4 is a schematic flowchart showing the main operations of a method for programming memory cells according to an embodiment of the present invention.

The operation of the program data latches 165 of FIG. 3 will be now explained with the help of the schematic flowchart of FIG. 4. The description below reflects for example the operation of programming a two-level memory cell, or the operation of programming the LSB of a two-level memory cell. It is intended that the programming operation is conducted in parallel on a group of memory cells (e.g., the memory cells of a memory page, in the case of a NAND memory).

Firstly, the latches L1, L2 and L3 are set/reset to prescribed starting conditions (block 405); in particular, the first verify latch L2 is set to a state such that the output B thereof is equal to "0", i.e., it does not affect the value of the output C of the NOR gate N1.

Then, the data to be programmed into the selected memory cell are loaded into the dataload latch L3 (dataload operation—block 405); the dataload operation also involves transferring the program data into the verify latch L1.

Then, a programming pulse is applied to the selected memory cell (block 410); in particular, in the example herein considered the programming pulse is applied to the selected memory cell on condition that C="0", i.e., being at the moment the output of the first verify latch L2 B="0", only if the content of the verify latch L1 (corresponding to the program data) is such that A="1". In the following, it is assumed that the memory cell has to be programmed, i.e., the program data loaded into the dataload latch L3 are "1".

After having applied the programming pulse, and before performing a program verify operation to assess whether the selected memory cell has attained the target programming state, the content of the verify latch L1 is transferred into the first verify latch L2, by activating the transfer gate TGD (block 415). In this way, the output of the first verify latch L2 switches to B="1", so that now also the content of the first verify latch L2 affects the output of the NOR gate N1.

Then, by activating the transfer gate TG1 the verify latch L1 is re-loaded with the content of the dataload latch L3 (block 420), i.e., with the program data.

The selected memory cell is now read to assess whether it has reached the target programming state (program verify operation, block 425). If the memory cell has reached the target programming state, the verify latch L1 is reset, otherwise it remains in the state such that its output A="1".

The next programming pulse is then applied to the memory cells under programming (block 430). If the considered memory cell has not yet reached the target programming state, the content of the verify latch L1 is still such that its output A="1", which forces the output of the NOR gate N1 to be C="0"; the memory cell receives the next programming pulse. If instead the memory cell has been verified as programmed to the target programming state, the verify latch L1 has been reset, so that its output A="0"; however, since it is B="1", the output C of the NOR gate N1 is again "0", and the memory cell, despite it has been verified as programmed to the target state, receives the next programming pulse.

If at this time all the memory cells that were to be programmed have been verified as programmed to the target programming state, the operations end (exit branch Y of decision block 435). Let it be instead assumed that there are one or more other memory cells of the group being programmed that have not yet reached the target programming state (exit branch N of decision block 435): the operations schematized by blocks 415 to 435 are iterated. At the first iteration, the content of the verify latch L1 is transferred into the first verify latch L2 (block 415); if the considered memory cell had been previously verified as programmed to the target programming state, the content of the verify latch is such that its output A="0", so the content of first verify latch L2 passes from a state corresponding to B="1" to a state corresponding to B="0": in this state, the first verify latch L2 does not affect any more the output C of the NOR gate N1.

Also, the verify latch L1 is re-loaded with the original program data, that are always available in the dataload latch L3 (block 420); thus, at the next program verify operation (block 425), the considered memory cell, albeit it has already been verified as correctly programmed in the previous iteration of the program operation, is again subjected to a verify operation. If the verify operation is successful (as it should be, due to the fact that the memory cell, in addition to having been already verified, has received an extra programming pulse which has further shifted its threshold voltage), the verify latch L1 is cleared (i.e., brought to a state such that A="0"); thus, the considered memory cell will not receive the next programming pulse.

In other words, the generic memory cell to be programmed:
 after the first successful program verify operation, receives an additional programming pulse that guarantees an adequate programming margin; and
 is constantly submitted to the program verify operation, regardless of the fact that it has already been verified as programmed to the target programming state.

It is underlined that, for the purpose of ensuring that the memory cell is always submitted to the program verify operation until the program operation is completed on the other memory cells of the group of cells being programmed in parallel, it is in principle sufficient to provide the dataload latch L3 and the verify latch L1: in this way, by re-loading the verify latch L1 with the content of the dataload latch L3 before any program verify operation, it would be ensured that the memory cell is submitted to the verify even if it has already been verified as programmed to the target programming state. In this case, no extra programming pulse is applied to the memory cell. However, according to the Applicant, albeit this implementation is possible, a memory cell, that was verified as correctly programmed at a certain time, may not pass the verify after a certain number (e.g., 2 or 3) of iterations; this may be due to changes in the biasing voltages actually experienced by the memory cell; this cell will thus receive the programming pulse following the unsuccessful verify operation; however, the evolution in time of the programming voltages is usually such that the memory cell would in this case undergoes an excessive threshold voltage shift, so that a memory cell that, e.g., had to be brought into the programming state "10" (distribution 202), is instead brought into the programming state "00" (distribution 203) or even "01" (distribution 204). On the contrary, the solution described above, that calls for applying to each memory cell to be programmed an extra programming pulse right after the first successful verify operation guarantees sufficient margin so as to practically avoid that a memory cell, after having been verified as programmed, is verified as not programmed.

FIG. 5 shows the effects of the application of the extra programming pulse in terms of threshold voltage distributions; it can be appreciated that, compared to the conventional distributions 201, 202, 203 and 204 of FIG. 2, the distributions 202, 203 and 204 corresponding to the states "10", "00" and "01" are slightly shifted towards higher threshold voltage values (e.g., of about 200-300 mV, i.e., the threshold voltage shift typically caused by the application of a single programming pulse). The read voltages VREAD1, VREAD2 and VREAD3 may accordingly be shifted, compared to their values in the situation depicted in FIG. 2, so as to remain more or less midway the centers of the distributions.

It is pointed out that the method described above may be applied in principle to any kind of electrically-programmable memory, irrespective of the architecture (NOR or NAND) of the memory matrix thereof and of the number of bits storable in the generic memory cell.

Figure 6:
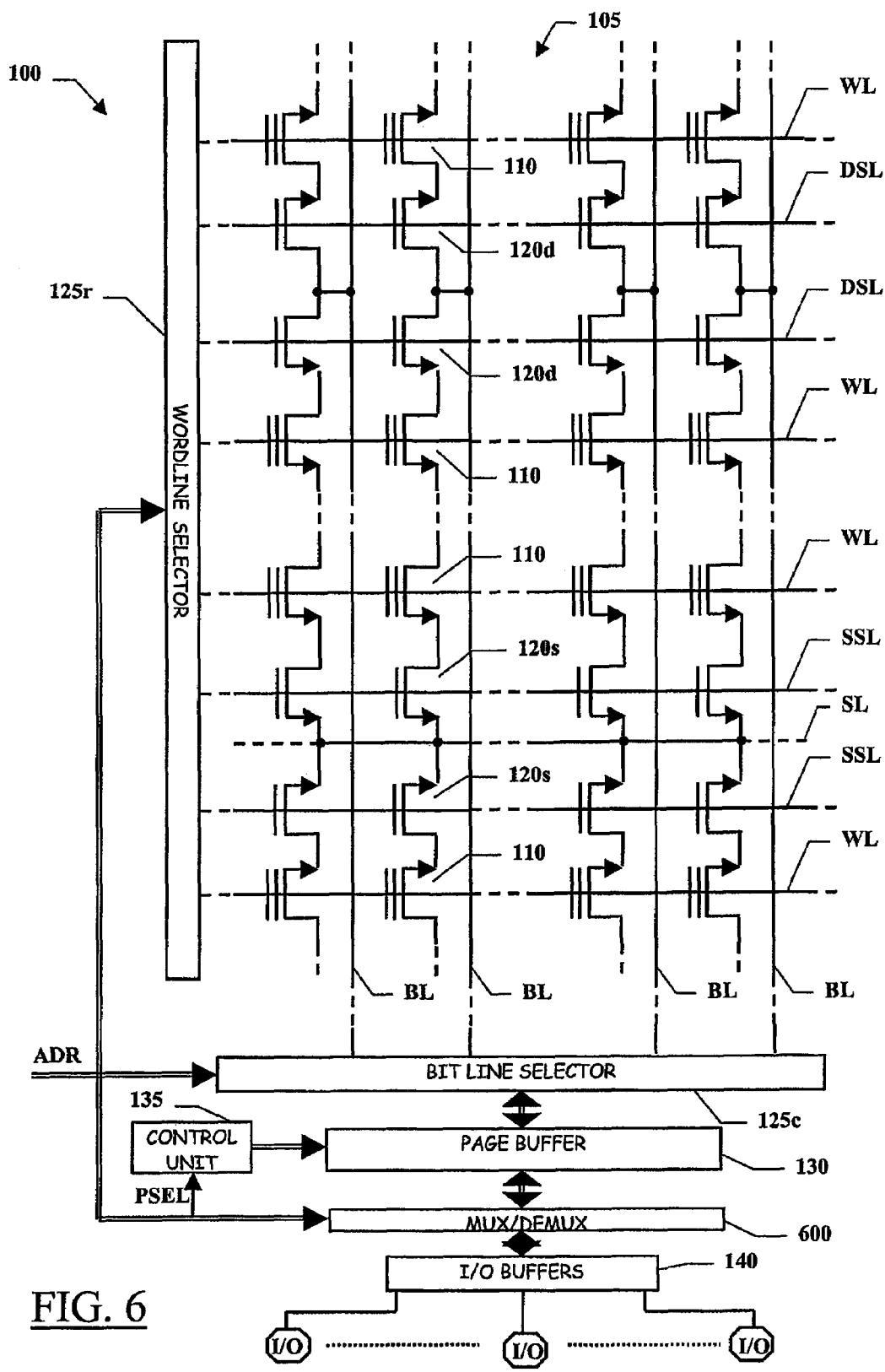
FIG. 6 is a simplified circuit schematic of a NAND memory wherein the present invention can be applied.
Figure 7:
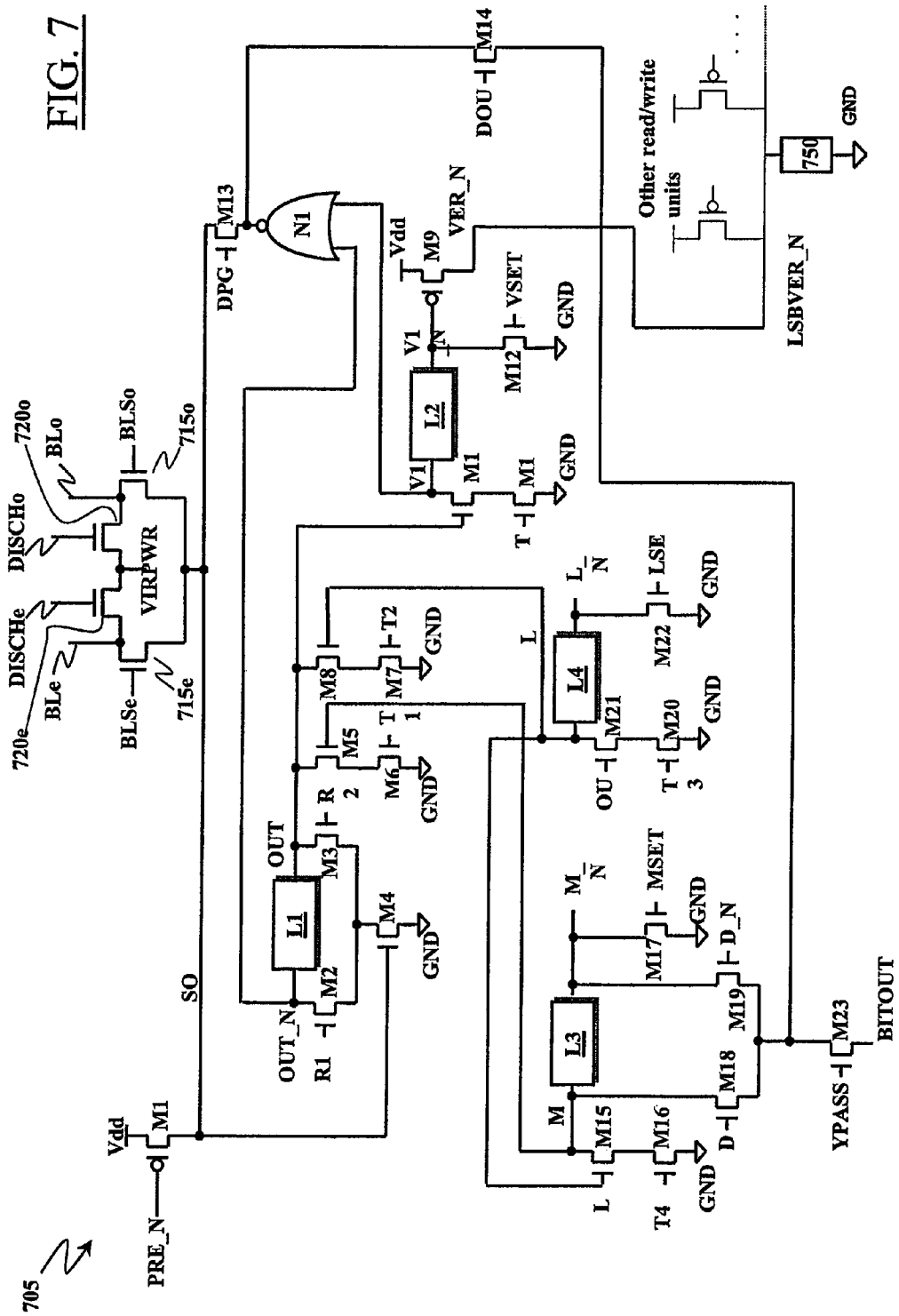
FIG. 7 is a circuit schematic of a read/write unit of a page buffer of the NAND memory of FIG. 6, according to an embodiment of the present invention.

Referring now to FIGS. 6 and 7, an invention embodiment specifically developed for a NAND flash memory is now described. In a NAND architecture, groups of, e.g., eight, sixteen or possibly more (e.g., thirty-two) memory cells 110 in the memory matrix 105 are connected in series to each other so as to form a respective memory cells string or stack, and the memory cells strings belonging to a same matrix column are connected in parallel to each other to a same bit line BL.

The memory cells 110 belonging to a generic string are in particular connected in series between a source select N-channel MOS transistor 120s and a drain select N-channel MOS transistor 120d. A generic, intermediate memory cell 110 in the memory cells string has the drain terminal connected to the source terminal of an adjacent memory cell 110 in the same string, and the source terminal connected to the drain terminal of another adjacent memory cell 110 in the same string. One of the two end memory cells 110 located at the ends of the string has the drain terminal connected to the source terminal of the drain select transistor 120d; the drain terminal of the drain select transistor 120d is connected to the corresponding bit line BL, as well as to the drain terminal of the corresponding drain select transistor 120d of an adjacent memory cells string. Likewise, the memory cell 110 at the other end of the string has the source terminal connected to the drain terminal of the source select transistor 120s; the source terminal of the source select transistor 120s is connected to the source terminal of the corresponding source select transistor 120s of another, adjacent memory cells string.

The control gate terminals of the memory cells 110 in each matrix row are connected to a corresponding word line WL. The gate terminals of the drain select transistors 120d belonging to a same row of the matrix 105 are all connected to a corresponding drain select line DSL; similarly, the gate terminals of the source select transistors 120s belonging to a common row are all connected to a corresponding source select line SSL. The drain terminals of the drain select transistors 120d belonging to a same column of the matrix 105 are connected to a corresponding bit line BL. The source terminals of all the source select transistors 120s in the matrix 105 are connected to a common source line SL (which is typically kept at a reference voltage, or ground).

The memory cells 110 belonging to the same matrix row are logically partitioned into different sets. Assuming, merely by way of example, that the memory matrix 105 includes 8192 (8K) bit lines BL, two sets of 4096 (4K) memory cells each for each word line WL may be defined; assigning for example to each bit line BL an index corresponding to an integer in a progression that starts with the left-most bit line in the drawing, a first set consists for example of the memory cells 110 in an even position (i.e., belonging to bit lines having an associated even index), and a second set consists of the memory cells 110 in an odd position (i.e., belonging to bit lines having an associated odd index).

For the purposes of the following description, it is assumed that the memory cells 110 are four-level memory cells, and that the correspondence between the logic values storable by the generic memory cell and the memory cell's threshold voltage values (or range of values) complies with the Gray coding discussed above.

In the example considered herein, each word line WL corresponds to four different memory pages, each one corresponding to a specific group of bits. More particularly, a first memory page (also referred to as "first LSB page") includes the LSBs stored in the memory cells belonging to bit lines BL in even positions (i.e., the first set of memory cells); a second memory page (also referred to as "first MSB page") includes the MSBs stored in the memory cells belonging to bit lines BL in even positions. A third memory page (also referred to as "second LSB page") includes the LSBs stored in the memory cells belonging to the bit lines BL in odd positions (i.e., belonging to the second set of memory cells), while a fourth memory page (also referred to as "second MSB page") includes the MSB stored in the memory cells belonging to bit lines BL in odd positions. Consequently, the data stored in a generic memory cell 110 belongs both to an LSB page (first or second) and to an MSB page (first or second).

Since each memory cell 110 can store two bits, each set of 4096 memory cells stores 1024 bytes. Consequently, each memory page stores 512 bytes. Thus, if, still by way of example, the memory matrix 105 includes 2048 word lines WL, the memory 100 has a total of 8192 memory pages of 512 bytes each. It is pointed out that, in practical implementations, the number of bit lines and word lines, as well as the size of the generic memory page, may greatly vary, not being a limitation for the present invention. In particular, the number of memory pages that are associated with a generic word line may be higher, particularly any number being a multiple of two, such as eight and so on.

The flash memory 100 may further include a plurality of redundant bit lines (not shown in the drawings, for the sake of clarity), adapted to functionally replace bit lines BL of the memory matrix 105 that, after the fabrication process of the flash memory and during a testing phase thereof, are possibly detected to be defective. Similarly, redundant word lines may be provided for functionally replacing defective word lines of the memory matrix 105.

The word line selector 125r is adapted to select the desired word line WL, as well as the corresponding drain select line DSL and the corresponding source select line SSL. A multiplexer/demultiplexer 600 is adapted to connect Input/Output (I/O) buffers 140, which are in turn associated with I/O terminals I/O of the memory 100, to a page buffer 130. Part of the address code ADR, denoted PSEL in the drawing, for example including one bit, is used for selecting which one of the (two, in the example) memory pages (the first/second MSB page, i.e., the memory page including the MSBs, or the first/second LSB page, i.e., the memory page including the LSBs of the memory cells of a given set) is addressed; another part of the address code ADR is supplied to the multiplexer/demultiplexer 600.

The page buffer 130 is exploited as a temporary data storage during read/program operations on the memory cells 110 of a selected set of memory cells. The page buffer 130 has a storage capability corresponding to the storage capability of a generic memory page. In order to fit an internal data parallelism of the flash memory 100 with a maximum external data parallelism, depending on a number p of the I/O terminals I/O (for example, p is equal to eight or sixteen), the multiplexer/demultiplexer 600 provides to the page buffer 130 a data word to be written into selected memory cells, or provides to the I/O terminals I/O a data word read from the selected memory cells, in chunks of p data bits at a time. Particularly, by decoding the received portion of the address code ADR, the multiplexer/demultiplexer 125c connects desired portions of the page buffer 130 to the memory I/O terminals I/O.

The operation of the flash memory 100 is generally managed by a control unit, schematized as a block identified as 135, for example an internal microcontroller or a finite-state machine.

A memory page is selected by selecting one word line WL, and a packet of bit lines BL; for example, if, as described in the foregoing, four memory pages, of 512 Bytes each, exist for each word line (the first LSB page, the first MSB page, the second LSB page and the second MSB page), the packet of selected bit lines BL includes either the 4096 bit lines in even position, or the 4096 bit lines in odd position. The selection of the word line WL is directly performed by the word line selector 125r, whereas the selection of the packet of bit lines BL is performed by the bit line selector 125c. By decoding the portion of the address code ADR fed thereto, the bit line selector 125c selects the desired packet of bit lines and connects them to the page buffer 130.

During a memory page read operation ("page read"), a data word stored in the selected memory page is read out and latched into the page buffer 130. The data word, temporarily stored in the page buffer 130, is then serially outputted through the I/O terminals I/O in chunks of, e.g., eight or sixteen bits, by means of the multiplexer/demultiplexer 600.

In greater detail, in order to access a given memory cell 110 for reading the content thereof, the drain select transistor 120d and the source select transistor 120s in the memory cells string to which the cell belongs are turned on, by asserting the drain select line DSL and the source select line SSL (for example, these two lines are brought to a voltage equal to the supply voltage Vdd of the memory); the bit line BL connected to the string of cells containing the memory cell to be read is selected by the bit line selector 125c. The word line selector 125r biases the word line WL to which the selected memory cell belongs to a specific reading voltage, e.g., one of the reading voltages VREAD1, VREAD2 or VREAD3 indicated in FIGS. 2 and 5, adapted to discriminate the programming state of the memory cell; the remaining word lines WL controlling the gates of the other memory cells of the same string are all brought to a potential sufficiently high to ensure that these memory cells are turned on irrespective of their programming state (for example, these word lines are brought to a voltage of approximately 5-6 V). All the other word lines WL, associated with different memory cells strings, are for example kept grounded.

Thanks to the adoption of the Gray coding, for reading the MSB contained in a generic memory cell 110, the word line selector 125r biases the word line WL to which the selected memory cell belongs to the reading voltage VREAD2, intermediate between the center threshold voltages of the distributions 202 and 203 of FIG. 2 or 5. If the threshold voltage of the selected memory cell 110 is lower than the reading voltage VREAD2, the selected memory cell 110 turns on and conducts a current, and this indicates that the MSB is equal to "1" (it has to be noted that it does not matter whether the selected memory cell belongs to either the distribution 201 or the distribution 202, because both of these distributions correspond to stored data having the MSB equal to "1"). Contrarily, if the threshold voltage of the selected memory cell 110 is higher than the reading voltage VREAD2, the selected memory cell 110 does not turn on and does conduct a current, thus indicating that the stored MSB is equal to "0". Thus, by means of just one read operation, the value of the MSB stored in the generic memory cell can be retrieved.

Two read operations may instead be necessary for reading the LSB. More specifically, a first read operation is performed biasing (by means of the word line selector 125*r*) the word line WL to which the selected memory cell belongs to the reading voltage VREAD1 intermediate between the center threshold voltages of the distributions 201 and 202. If the threshold voltage of the selected memory cell 110 is lower than the reading voltage VREAD1, the selected memory cell 110 turns on and conducts a current, thus indicating that it belongs to the distribution 201 (first programming state), and that the stored LSB is equal to "1". In this case, just one read access is sufficient for retrieving the stored LSB. Contrarily, if the threshold voltage of the selected memory cell 110 is higher than the reading voltage VREAD1, the selected memory cell 110 does not conduct current, thus indicating that it does not belong to the distribution 201. In this case, a second read operation needs to be performed, biasing the word line WL to which the selected memory cell belongs to the reading voltage VREAD3 intermediate between the center threshold voltages of the distributions 203 and 204. If the threshold voltage of the selected memory cell 110 is lower than the reading voltage VREAD3, then the selected memory cell 110 conducts, and this indicates that the LSB is equal to "0" (indeed, the first reading operation already indicated that the threshold voltage is higher than VREAD1). Conversely, if the threshold voltage of the selected memory cell 110 is higher than the reading voltage VREAD3, the selected memory cell 110 does not conduct, and this indicates that its threshold voltage belongs to the distribution 204, and that the LSB is equal to "1".

During a memory page program operation ("page program"), a data word to be written into a specified memory page, received from outside the memory through the I/O terminals I/O, is loaded into the page buffer 130. The data word to be written is received serially in chunks of, e.g., eight or sixteen bits, and the page buffer 130 is thus replenished with data in a sequence of steps; when the buffer has eventually been filled, the data are written in parallel into the memory cells of a selected page.

In order to access a given memory cell 110 for programming it, the drain select transistor 120*d* in the memory cells string to which the memory cell belongs is turned on by asserting the drain select line DSL (for example, bringing it to the memory device supply voltage Vdd), whereas the source select transistor 120*s* is kept off by keeping the source select line SSL deasserted (e.g., grounded); the bit line BL connected to the string of cells containing the memory cell to be programmed is selected by the bit line selector 125*c*. The word line selector 125*r* biases the word line WL to which the selected memory cell belongs to a programming voltage VPROG, whose value evolves in time depending on the target programming state of the memory cell 110.

As mentioned in the foregoing, the programming state of a generic memory cell 110 corresponds to the threshold voltage value thereof, that is in turn determined by the amount of charge injected into the cell's floating-gate electrode. As known in the art, the amount of charge that is injected into the floating-gate electrode of a floating-gate MOS transistor is proportional to the value and to the rate of increase of the programming voltage VPROG that is applied to the control gate of the memory cell 110 (e.g., the higher the target threshold voltage value, the higher the value of the programming voltage VPROG to be applied). The remaining word lines WL, connected to the control gates of the other memory cells of the same string are all brought to a relatively high potential (e.g., approximately 10 V), adapted to ensure that these memory cells are not spuriously programmed. All the other word lines WL, associated with different memory cells strings, are for example kept grounded. In order to program the selected memory cell, the bit line BL to which the selected memory cell belongs is kept grounded, so that the drain select transistor 120*d* is kept turned on; the ground voltage applied to the bit line of the selected cell, propagating through the drain select transistor and the channel of the memory cells in the string, reaches the channel of the memory cell to be programmed; here, the voltage difference between the control gate (at the programming voltage VPROG) and the channel (close to the ground voltage) experienced by the selected memory cell is sufficient to cause F-N electron tunneling into the memory cell's floating gate. On the contrary, if the bit line is biased at a higher potential, for example equal to the memory supply voltage (Vdd, e.g., 3 V), as the drain select line DSL, the drain select transistor 120*d* turns off. The channels of the memory cells of the selected memory cells string thus remain floating, and, thanks to the relatively high voltage (e.g., 10 V) applied to the word lines WL of the string not connected to the selected memory cell, the string voltage rises, due to capacitive coupling, to a value such that the control gate-to-channel voltage difference at the selected memory cell is not sufficient to cause significant electron tunneling, and the memory cell is not programmed. In this way, by applying to the selected bit lines the proper voltage, the memory cells 110 of the selected memory page to be programmed are brought into the desired programming state, whereas the other cells 110, not to be programmed, are left unchanged.

Similarly to the case of the read operation, a program operation for programming both the LSB and the MSB requires is accomplished in more steps. More specifically, assuming that each program operation is performed on erased memory cells 110 (i.e., memory cells in the first programming state, corresponding to a stored "11", with threshold voltage values in the first distribution 201), an LSB program operation is firstly performed: if the target programming state for the selected memory cell 110 corresponds to an LSB value equal to "0", a sequence of programming pulses is applied to the selected memory cell, to bring the threshold voltage thereof to the distribution 202 (i.e., to the second programming state). Otherwise, the threshold voltage of the selected memory cell 110 is left in the first distribution 201 (first programming state, or erased state). After having set the LSB to the target value, the program operation is completed by programming the MSB. If the target programming state for the selected memory cell 110 is such that the MSB value is equal to "1", the threshold voltage of the memory cell is left at the value it reached in the previous step (i.e., in the distribution 201 if the target LSB value is equal to "1", and in the distribution 202 if the target LSB value is equal to "0"). On the contrary, if the target programming state for the selected memory cell 110 corresponds to an MSB value equal to "0", the threshold voltage of the selected memory cell has to be brought to the distribution 204 (i.e., to the fourth programming state) if the LSB value is equal to "1" (i.e., if the threshold voltage before programming the MSB belonged to the distribution 201), or, if the LSB is equal to "0" (i.e., if the threshold voltage before programming the MSB belonged to the distribution 202) to the distribution 203 (i.e., to the third programming state).

In a practical implementation, at each programming pulse that is applied to the memory cells to be programmed, the programming voltage VPROGR is increased (at least up to a maximum value, e.g., 20 V); after the application of the programming pulse, a verify operation is performed for assessing whether the memory cells have reached the target threshold voltage value.

In an erase operation, a group of memory cells 110, i.e., in the example herein considered, a group of memory cells 110 corresponding to all the word lines WL of a string, is brought back to the erased state (logic value "11").

In order to erase a given group of memory cells 110, the semiconductor region including all the cells of the memory matrix 105 may be biased to a relatively high erase voltage VERASE (e.g., 20V) by means of an erase control circuit, not shown in the drawings, and all the bit lines BL of the matrix 105 are kept floating. The word line selector 125r biases the word lines WL corresponding to the group of memory cells to be erased to the ground voltage, while the remaining word lines WL of the memory matrix 105 are left floating. The drain select line DSL and the source select line SSL corresponding to the group of memory cells to be erased are kept floating (after having been precharged to about the supply voltage Vdd before the above-mentioned semiconductor region is biased to the erase voltage VERASE), while the remaining drain select lines and source select lines are kept grounded. In this way, each memory cell 110 in the group of memory cells to be erased is biased in such a way to trigger the removal (by means of tunneling effect) of the electric charge possibly stored in its floating gate. Also the erase operation is in the practice more complex, including erase verify phases and soft program operations.

A page buffer 130 for a NAND memory according to an embodiment of the present invention includes a plurality of read/write units 705 having the structure depicted in FIG. 3. Each read/write unit 705 is in the considered example associated with a respective pair of (e.g., adjacent) bit lines BLe, BLo (pairs of redundant bit lines are associated with corresponding read/write units, similar to the read/write unit 705). Unless differently specified, the signals described in connection with FIG. 7 are to be intended as logic signals, taking either one of two voltage values, particularly the supply voltage Vdd and the ground voltage GND.

In particular, the pair of bit lines associated with the generic read/write unit 705 includes an even bit line BLe and an odd bit line BLo, that are electrically coupleable to a common circuit node SO through respective N-channel MOS transistors 715e and 715o, included in the bit line selector 125c. The transistors 715e and 715o have the respective drain terminals connected to the corresponding bit line BLe and BLo, and the source terminals connected to the circuit node SO; the gate terminals of the transistors 715e and 715o are controlled by respective select signals BLSe and BLSo, respectively. The bit line selector 125c also includes, for each bit line pair, two N-channel MOS transistors 720e and 720o, each one adapted to precharge/discharge the respective bit line BLe and BLo to a proper biasing voltage VIRPWR, depending on the operation to be performed. To this purpose, the transistors 720e and 720o have the source terminals connected to the corresponding bit lines BLe, BLo, the drain terminals connected together and to a terminal adapted to provide the biasing voltage VIRPWR, and the gate terminals controlled by respective precharge/discharge signals DISCHe, DISCHo.

A P-channel MOS transistor M1 is provided in the read/write unit 705 for precharging the circuit node SO during certain phases of the page buffer operation, e.g., at the beginning of a read/program operation. The transistor M1 has the drain terminal connected to the circuit node SO, the source terminal connected to a terminal providing the supply voltage Vdd, and the gate terminal controlled by a pre-charge enabling signal PRE_N.

The generic read/write unit 705 of the page buffer 130 includes a first latch L1, a second latch L2 a third latch L3, corresponding respectively to the latches L1, L2 and L3 of the circuit of FIG. 3 (and for this reason denoted with the same reference numerals); a fourth latch L4 is further provided. Each one of the four latches L1, L2, L3 and L4 consists for example of a pair of cross-connected (CMOS) inverters.

The first latch L1 has a first input/output node OUT and a second, logically complemented input/output node OUT_N. The first input/output node OUT is connected to the drain of an N-channel MOS transistor M3 and the second input/output node OUT_N is connected to the drain of an N-channel MOS transistor M2. The transistors M2 and M3 are controlled by respective signals R1 and R2, and have the respective source connected to the drain of an N-channel MOS transistor M4. The transistor M4 has the gate connected to the circuit node SO, and the source connected to ground.

The first input/output node OUT of the first latch L1 is also connected to the drain of an N-channel MOS transistor M5 connected in series to an N-channel MOS transistor M6 controlled by a signal T1 (corresponding to the signal T1 of FIG. 3) and having the source connected to ground. The transistor M5 is controlled by a first input/output node M of the third latch L3.

The first input/output node OUT of the first latch L1 is also connected to the drain of an N-channel MOS transistor M8 connected in series to an N-channel MOS transistor M7 controlled by a signal T2 and having the source connected to ground. The transistor M8 is controlled by a first input/output node L of the fourth latch L4.

The first input/output node OUT of the first latch L1 is further connected to the gate of an N-channel MOS transistor M10 having the drain connected to a first input/output node V1 of the second latch L2, and connected in series to an N-channel MOS transistor M11 controlled by a signal TD (corresponding to the signal TD of FIG. 3) and having the source connected to ground.

The first input/output node V1 of the second latch L2 is connected to a first input of a two-inputs NOR gate N1, corresponding to the NOR gate N1 of FIG. 3; a second input of the NOR gate N1 is connected to the second input/output node OUT_N of the first latch L1.

The output of the NOR gate N1 is connected to the source of an N-channel MOS transistor M13 controlled by a signal DPGM and having the drain connected to the circuit node SO.

A second, complemented input/output node V1_N of the second latch L2 is connected to the drain of an N-channel MOS transistor M12, controlled by a signal VSET and with source connected to ground; the second input/output node V1_N of the second latch L2 is also connected to the gate of a P-channel MOS transistor M9 with source connected to the supply voltage Vdd and drain connected to a signal line VER_N. The signal line VER_N is connected to the drain of transistors equivalent to the transistor M9 in the other read/ write units 705 of the page buffer 130, and to a pull-down element 750, so as to form a wired-NAND structure.

The first input/output node M of the third latch L3 is further connected to the drain of an N-channel MOS transistor M15 controlled by the first input/output node L of the fourth latch L4, and connected in series to an N-channel MOS transistor M16 controlled by a signal T4 and having source connected to ground. A second input/output node M_N of the third latch L3 is connected to the drain of an N-channel MOS transistor M17 controlled by a signal MSET and with source connected to ground.

The first input/output node L of the fourth latch L4 is further connected to the drain of an N-channel MOS transistor M20 controlled by a signal OUT and connected in series to an N-channel MOS transistor M20 with source connected to ground and controlled by a signal T3. A second, complemented input/output node L_N of the fourth latch L4 is connected to the drain of an N-channel MOS transistor M22 with source connected to ground and controlled by a signal LSET.

The first and second input/output nodes M and M_N of the third latch L3 are connected to the drain of N-channel MOS transistor M18 and M19, respectively, controlled by signals D and D_N. The transistors M18 and M19 have the respective source connected to the drain of an N-channel MOS transistor M23, controlled by a signal YPASS, with source connected to an I/O data line BITOUT in turn connected to the multiplexer/demultiplexer 600. The drain of the transistor M23 is further connected, through an N-channel MOS transistor M14 controlled by a signal DOUT, to the output of the NOR gate N1.

The first latch L1 is exploited in the operations of reading and verifying the programming state of the MSB stored in the selected memory cell, reading and verifying the programming state of the LSB stored in the selected memory cell, and verifying the erased state of the selected memory cell.

The second latch L2 is exploited for enabling the application to a memory cell being programmed the extra programming pulse discussed above, after the memory cell has been verified as having reached the target programming state.

The third latch L3 is exploited for loading and retaining the data to be programmed into the selected memory cell during the program operation; the third latch L3 is further exploited for reloading into the first latch L1 the datum corresponding to the target LSB state, and for reloading the datum corresponding to the target MSB state.

The fourth latch L4 is exploited for reloading into the first latch L1 the datum corresponding to the target MSB state.

The NOR gate N1 and the transistor M13 are exploited for programming the LSB and the MSB into the selected memory cell.

The transistors M18, M19 and M23 are exploited for loading into the page buffer the data to be programmed into the selected memory cell.

The transistors M2, M3 and M4 are exploited for reading and verifying the selected memory cells.

The transistor M12 serves for setting the second latch L2; the transistor M17 serves for setting the third latch L3; the transistor M22 serves for setting the fourth latch L4.

The transistor M1 serves for connecting the circuit node SO to the supply voltage Vdd.

The transistors M5 and M6 serve for transferring the content of the third latch L3 into the first latch L1.

The transistors M7 and M8 serve for transferring the content of the fourth latch L4 into the first latch L1.

The transistors M20 and M21 serve for transferring the content of the first latch L1 into the fourth latch L4.

The transistors M10 and M11 serve for transferring the content of the first latch L1 into the second latch L2.

The transistor M9 is one pull-up element of the wired NAND structure used for assessing that all the memory cells of a memory page under programmed has reached the target programming state.

The transistors M14 and M23 are used for transferring the read datum onto the I/O signal line BITOUT.

In the following, the operation of the page buffer 130 will be described in detail. For the sake of conciseness, only the case in which the selected memory cells 110 that are to be read, programmed and erased are connected to the even bit lines BLe is considered (i.e., memory cells corresponding to even memory pages), the case of memory cells belonging to odd bit lines BLo being exactly the same. More specifically, the following description will refer in particular to a single read/write unit 705. Consequently, although reference will be made also to whole memory pages, the description will deal in great detail only with a single memory cell 110 thereof, and with its corresponding string.

Read Operations

LSB Read Operation

As previously mentioned, thanks to the adoption of the Gray coding and thanks to the fact that the data stored in each single memory cell belong to two memory pages (i.e., both to the first/second LSB page and to the first/second MSB page), an LSB read operation requires at most two read accesses, one exploiting the reading voltage VREAD1, and possibly another one exploiting the reading voltage VREAD3.

The first and second latches L1 and L2 are properly set.

Firstly, the second latch L2 is set. The signal PRE_N is asserted low (i.e., to the ground voltage GND), so as to turn the transistor M1 on; the circuit node SO is thus brought to the supply voltage Vdd. Substantially at the same time, the signal R1 is asserted high (i.e., to the voltage supply Vdd), so as to turn the transistor M2 on; the transistor M4 is also on, being the circuit node SO at the supply voltage Vdd; thus, a conductive path from the second input/output node OUT_N of the first latch L1 to the ground is established; the node OUT_N is thus forced to the ground. The first input/output node OUT of the first latch L1 is consequently switched to the supply voltage Vdd, thus the transistor M10 is turned on; the signal TD is kept high in this phase, thereby a conductive path between the first input/output node V1 of the second latch L2 and the ground is established, and the second latch L2 is set. This setting of the second latch L2 ensures that the NOR gate N1 behaves as a simple inverter in respect of the logic signal present on the node OUT_N.

Then, the first latch L1 is set: to this purpose, after having deasserted the signal R1, the signal R2 is asserted high, so as to turn the transistor M3 on; a conductive path is thus established between the node OUT and the ground; the node OUT is thus forced to ground.

After having set the two latches L1 and L2, the reading of the LSB starts. While the transistor M1 is still kept on, a prescribed voltage V1 of, for example, 2-2.4 V is applied, through the signal line BLSe, to the gate of the selector transistor 715e, and the bit line BLe charges to a voltage equal to V1−VTHN, where VTHN is the threshold voltage of the selector transistor 715e. Meanwhile, all the word lines corresponding to the other memory cells in the string are brought to a voltage sufficiently high to make the other cells of the string act as pass transistors, the word line to which the addressed memory cell 110 belongs is brought to the voltage VREAD1, and the drain select line DSL is brought to the supply voltage Vdd, so as to turn the transistor 120 on.

The evaluation phase starts: the signal PRE_N is deasserted, and the transistor M1 turns off; the signal line BSLe is brought to ground, so as to turn the selector transistor 715e off; the source select transistor 120s is turned on, by bringing the source select line SSL high; in this way, the string of cells is enabled to conduct current, depending on the state of the selected memory cell; the bit line BLe is left floating: if the addressed memory cell has a threshold voltage lower than the voltage VREAD1 applied to its word line, the memory cell sinks a current, and, due to the consequent discharge, the potential of the bit line BLe decreases; if instead the selected memory cell has a threshold voltage higher than the voltage VREAD1, it does not sink current, and the bit line BLe remains at the potential V1−VTHN.

At the end of the evaluation phase, the signal line BLSe is brought to a voltage V2, with V2<V1; if, due to the current sunk by the selected memory cell, the potential of the bit line BLe has fallen below the value V2−VTHN, the selector transistor 715e turns on, and the potential of the circuit node SO becomes equal to the potential of the bit line BLe; otherwise, the node SO remains at the supply voltage Vdd.

The signal R1 is now asserted high; if the potential of the node SO decreased, due to the current sunk by the selected memory cell, the first latch L1 does not switch (the transistors M2 and M4 and those making up the first latch L1 are properly dimensioned to this end), and the node OUT_N remains at "1". This situation indicates that the threshold voltage of the addressed memory cell falls in the first distribution 201. If on the contrary the potential of the node SO remained at the supply voltage Vdd, the first latch L1 (which was set to a state such that OUT="0") switches, and the node OUT_N passes from "1" to "0" (accordingly, the node OUT thus passes from "0" to "1"). This situation indicates that the threshold voltage of the selected memory cell belongs to either one of the distributions 202, 203 and 204.

In this case, a second read operation is necessary to discriminate among the three distributions 202, 203 and 204. The second read operation is conducted in a way similar to the first read operation, with the exception that the word line of the selected memory cell is now biased to the voltage VREAD3, and the signal R2 is asserted instead of the signal R1. If the potential of the circuit node SO remains at the supply voltage Vdd (this occurs only in case the selected memory cell has a threshold voltage falling in the fourth distribution 204, and thus it does not sink current), the node OUT is brought to the ground, and correspondingly the node OUT_N is brought to "1". If instead the potential of the circuit node SO fell from the supply voltage Vdd, because the selected memory cell sinks a current, the latch L1 remains in the same condition as after the first read operation, with the node OUT at "1" if the selected memory cell has a threshold voltage falling in the first distribution 201, and the node OUT at "0" if the selected memory cell has a threshold voltage falling in the second or third distributions 202 or 203.

After the reading, the value of the LSB stored in the selected memory cell thus corresponds to the potential of the node OUT. The read datum can be transferred to output buffers of the memory device by activating the transistor M14 (asserting the signal DOUT high) and the transistor M23 (asserting the signal YPASS high); thanks to the initial setting to "0" of the node V1, the NOR gate N1 behaves as an inverter in respect of the signal present on the node OUT_N, thus at the output of the NOR gate N1 a logic value corresponding to that of the node OUT is made available. The read datum is thus made available on the line BITOUT, and transported from here to the memory output buffers.

Figure 8:
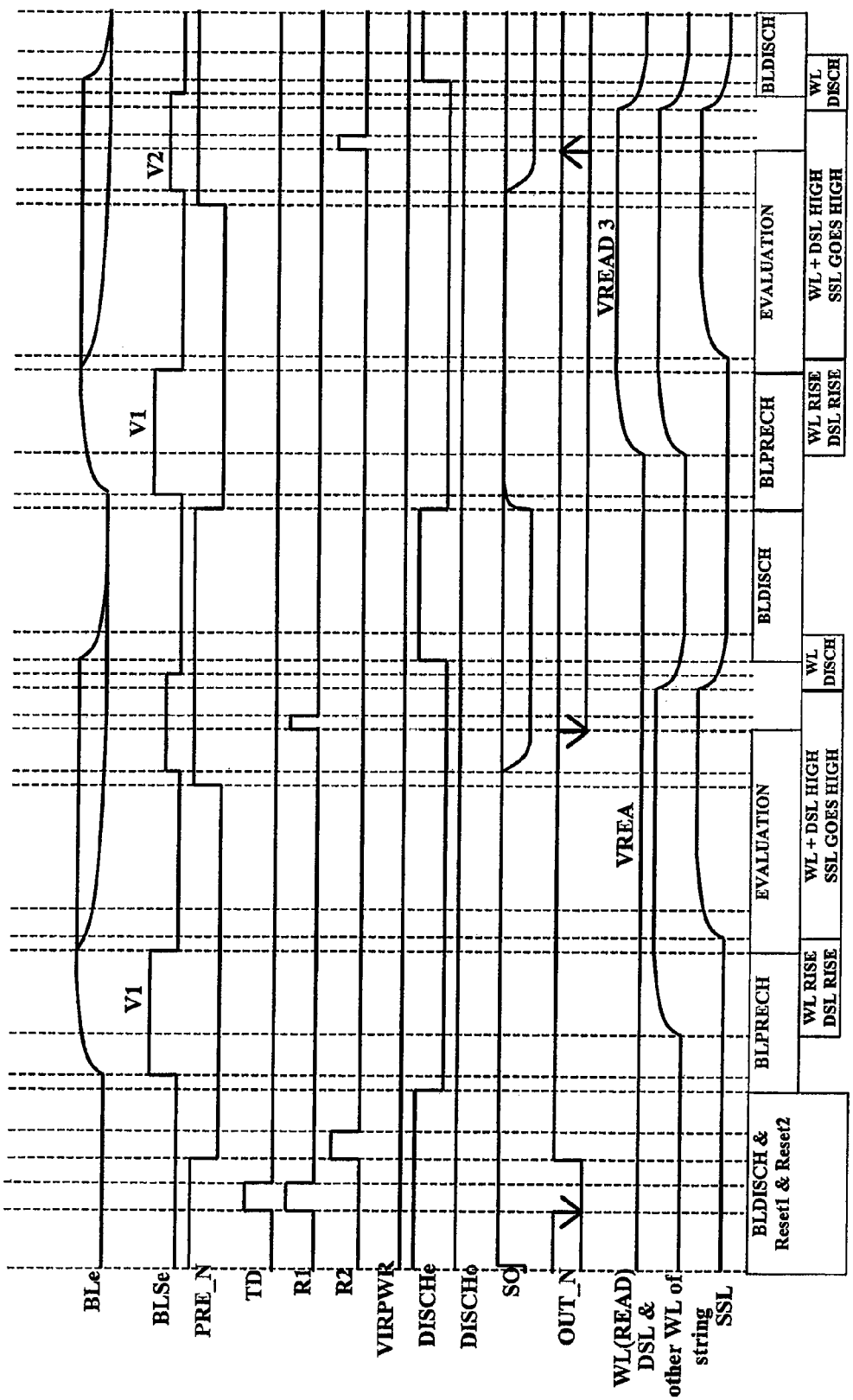
FIG. 8 illustrates the timing of a read operation for reading a Least Significant Bit (LSB) stored in the memory cells of a memory page of the NAND memory.

The diagram of FIG. 8 shows the timing of a plurality of signals that are involved in the memory device during an LSB read operation is illustrated.

It is remarked that, for performing the LSB read operation, one or at most two read accesses to the selected memory cells are necessary. This is possible thanks to the choice of using the Gray coding for associating the logic values to the corresponding states, and thanks to the fact that the data stored into each single memory cell belongs to two memory pages.

MSB Read Operation

Similarly to the LSB read operation, in the MSB read operation the second latch L2 is initially set so as to ensure that the NOR gate N1 behaves as a simple inverter in respect of the logic signal at the node OUT_N. To this purpose, the same operations described in connection with the LSB read operation are performed.

Also, similarly to the LSB read operation, the first latch L1 is then set, by means of the same operations described above.

The reading of the MSB is similar to the reading of the LSB. The bit line BLe is charged to a voltage equal to V1−VTHN by asserting low the signal PRE_N and bringing the signal BLSe to a voltage V1. The word line to which the selected memory cell belongs is biased to the reading voltage VREAD2. The signal R1 is asserted high, in order to turn the transistor M2 on.

If the selected memory cell has a threshold voltage lower than the voltage VREAD2, it sinks a current and discharges the bit line BLe; the potential of the node SO falls from the precharge value Vdd; the node OUT_N remains at a voltage corresponding to a "1"; on the contrary, if the selected memory cell has a threshold voltage higher than the voltage VREAD2, it does not sink current, the bit line is not discharged, and the node SO remains at the supply voltage Vdd; the first latch L1 switches, and the potential of the node OUT_N falls to the ground (corresponding to a "0").

The read datum, stored in the first latch L1, can be transferred to the line BITOUT, and thus to the memory output buffers, in the same way described in connection with the LSB read operation.

Figure 9:
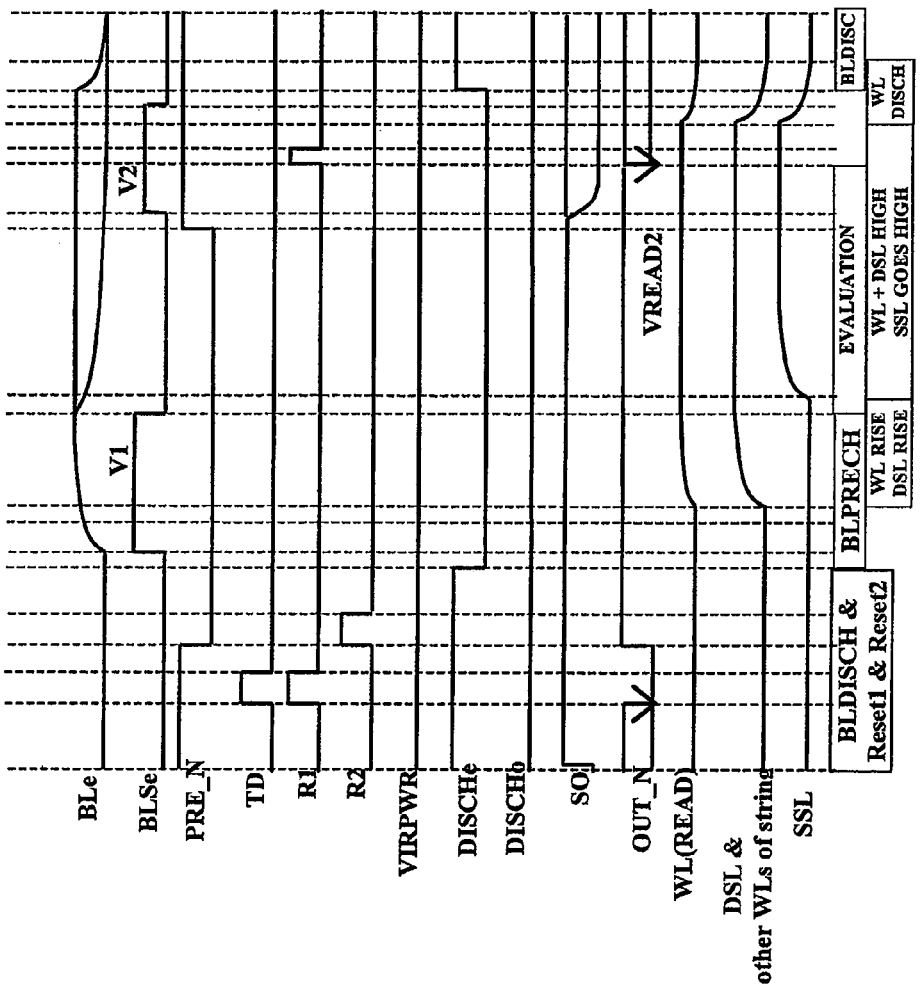
FIG. 9 illustrates the timing of a read operation for reading the Most Significant Bit (MSB) stored in the memory cells of a memory page of the NAND memory.

The diagram of FIG. 9 shows the timing of a plurality of signals that are involved in the memory device during an MSB read operation is illustrated.

The fact that the page buffer 130 performs an MSB read operation rather than an LSB read operation (or vice versa) depends on whether an MSB memory page rather than an LSB memory page has been addressed. This is controlled by the control unit 135 that decodes and recognizes the value of the address portion PSEL. The control unit 135 generates all the signals controlling the execution of the LSB read operation (e.g., applying the reading voltages VREAD1 and VREAD3) or the MSB read operation (e.g., applying the reading voltage VREAD2), depending on the value of the address portion PSEL.

Program Operations

Memory cells that belong to a same word line are programmed in parallel. The selected word line is applied a sequence of programming voltage pulses, which are applied to all the memory cells connected to that word line. The read/write units 705 of the page buffer 130 determine which memory cells of the selected word line are to be programmed, and which not. In particular, as will be described in detail in the following, the read/write units 705 of the page buffer 130 determine which memory cells of the selected word line are to be programmed and which not by properly biasing the respective bit lines.

In the following, it is assumed that the memory cells are initially all in the erased state, corresponding to threshold voltages in the first distribution 201.

LSB Program Operation

Initially, the first and second latches L1 and L2 of the generic read/write unit 705 are reset, by asserting the signals PRE_N (low), R1 (high) and VSET (high); in this way, the latches L1 and L2 are set in such a way that the nodes OUT and V1 are set to "1".

The data to be programmed into the selected memory page are then loaded into the page buffer 130. In particular, the data are loaded into the first latch L1 of the read/write units 705 ("dataload" phase). To this purpose, the data are firstly loaded into the third latch L3. The line BITOUT is forced to ground, the transistor M23, assumed to be part of the column selection circuitry, is turned on (the signal YPASS is asserted high). Either one or the other of the transistors M18 or M19 is then turned on, depending on the datum to be loaded. In particular, if the datum to be loaded is a "1", the signal D is asserted high, and correspondingly the signal D_N is kept low; in this way, the node M is brought to ground, while the node M_N is brought to the supply voltage Vdd. On the contrary, if the datum to be loaded is a "0", the signal D is kept low, and the signal D_N is asserted high; in this way, the node M_N is brought to ground, and the node M is kept at the supply voltage Vdd. It is pointed out that if the (LSB of the) selected memory cell has to be programmed, the datum to be loaded into the third latch L3, i.e., the logic state of the node M is "1" whereas if the (LSB of the) memory cell is not to be programmed, the datum to be loaded into the third latch L3, i.e., the logic state of the node M is "0".

After having loaded the target datum into the third latch L3, the content of this latch is transferred into the first latch L1. This operation, also referred to as "transfer T1" hereinafter, is accomplished by asserting high the signal T1, so as to turn the transistor M6 on; the node OUT is either brought to ground or left at the supply voltage Vdd depending on the logic sate of the node M. After the transfer T1 operation, the logic state of the node OUT equals the logic state of the node M_N.

The content of the first latch L1 is then transferred into the second latch L2. This operation, hereinafter also referred to as "transfer TD", is accomplished by asserting high the signal TD. If the memory cell is to be programmed, the node V1 remains at "1", otherwise it is brought to "0".

The programming phase then begins. As in the read operations described in the foregoing, the bit lines are firstly precharged to a prescribed voltage. In particular, the line VIRPWR is brought to the supply voltage Vdd, and the transistors 720e and 720o are turned on, biasing their gates to a voltage higher than the supply voltage Vdd of at least their threshold voltage.

Before applying the programming pulse to the selected word line, the signal DPGM is asserted high so as to turn the transistor M13 on. Also, under the assumption that the accessed memory cell belongs to the even bit line BLe, the transistor 715e is turned on, by bringing the signal BLSe to the supply voltage Vdd. If the output of the NOR gate N1 is "0", the bit line BLe is discharged to ground, otherwise it remains at the precharge voltage Vdd. When the programming pulse is applied to the selected word line, the memory cell receives the programming pulse (i.e., some charge is injected into its floating gate) only if the bit line potential is equal to ground, otherwise the memory cell does not receive the programming pulse.

As mentioned in the foregoing, the memory cells are programmed by slightly increasing their threshold voltage at each programming pulse. Generally, a number of programming pulses are used to bring a generic memory cell into a target programming state starting from an initial programming state; the precise number of programming pulses used to bring a generic memory cell into a target programming stated cannot be determined a priori; also, memory cells belonging to the same set selected for programming, i.e., to the same word line and, e.g., to the even or odd bit lines, typically have to be programmed to different target programming states. For all these reasons, after applying each programming pulse, a program verify phase is performed, for assessing whether one or more of the memory cell of the selected word line has attained the target programming state.

When a memory cell is verified as correctly programmed to the target programming state, the content of the first latch L1 is destroyed as a result of the memory cell being read as programmed. In order to ensure that the generic memory cell, upon being verified as programmed to the target programming state, is applied an extra programming pulse, and continues to be verified until the program operation is completed on all the cells of the selected set, before performing any program verify operation a transfer TD operation is performed, so as to load into the second latch L2 the content of the first latch L1; then, a transfer T1 operation is performed to re-load the first latch L1 with the original datum (available in the third latch L3).

The program verify operation is similar to a read operation, exception made for the fact that it is not preceded by any reset of the latches, performed by biasing the selected word line to the voltage VFY1 that, in an embodiment of the present invention, is slightly higher that the read voltage VREAD1; however, it is pointed out that a distinctive advantage is that, thanks to the fact that an extra programming pulse is applied to the memory cells to be programmed, the verify voltage VFY1 may be equal to the read voltage VREAD1, because the application of the extra programming pulse already guarantees a safety margin.

The verify phase begins with the precharge of the bit line BLe to the voltage V1–VTHN, as in the LSB read operation. A read operation as described in the foregoing is performed, biasing the selected word line to the voltage VFY1, precharging the node SO to the supply voltage Vdd and asserting the signal R1 high.

If the memory cell is not yet programmed to the target programming state, it sinks a current, so that the node SO is discharged; the node OUT remains at "0".

If the memory cell is correctly programmed to the target programming state, the node SO remains at the supply voltage Vdd (the memory cell does not sink a current in this case), the node OUT_N is brought to ground, and the node OUT switches to "1".

The next programming pulse is then applied to the selected word line. Irrespective of the fact that the considered memory cell was verified as programmed to the target programming state in the previous program verify phase, it will receive the next programming pulse. In fact, if the cell was not verified as programmed, the node OUT is at "0", the node OUT_N is at "1", and this forces the output of the NOR gate N1 to "0"; but even if the cell was verified as programmed, and the node OUT was brought to "1" (and the node OUT_N was brought to "0", unblocking the NOR gate N1), the output of the NOR gate N1 will be again "0", due to the fact that the node V1 is still at "1".

After the programming pulse, and before performing the next program verify operation, a transfer TD operation is performed, asserting the signal TD high: in case the previous program verify operation was successful, so that the node OUT is "1", the node V1 is brought to "0", so the content of the latch L2 will no more affect the output of the NOR gate N1, which will only depend on the state of the node OUT_N, i.e., on the result of the following program verify operations (on the contrary, if the previous program verify operation was unsuccessful, nothing changes: the nodes OUT and V1 remain at "0" and "1", respectively).

A transfer T1 operation is then performed, to re-load into the first latch L1 the original datum loaded into the read/write unit of the page buffer, available in the third latch L3.

Then, a new program verify operation is performed, in the way described above; if the memory cell is verified as programmed, the node OUT switches to "1", so, if the memory cell had already been verified previously, and the node V1 is at "0", at the next programming pulse the output of the NOR gate N1 remains at "1", and the bit line remains charged at the supply voltage Vdd (no programming pulse is thus applied to the memory cell).

Thus, since the first latch L1 is always re-loaded with the original datum before performing a program verify operation, the memory cell continues to be verified even if it has already been verified as programmed in a preceding iteration of the program operation. Due to this, it is possible that a memory cell, previously verified as programmed to the target state, during a successive program verify operation is no longer verified as programmed: if this happens, the memory cell receives the following programming pulse. However, this is considered quite unlikely, because the extra programming pulse that the memory cell received after having been verified as programmed should guarantee a sufficient margin.

The above operations are iterated until the second latch L2 in all the read/write units 705 of the page buffer 130 has been reset, i.e., the node V1 brought to "0": when this happens, the transistors M9 in all the read/write units 705 are off, so the node VER_N, which is the output of the wired-NAND, falls to ground. This indicates the end of the LSB program operation.

Figure 10:
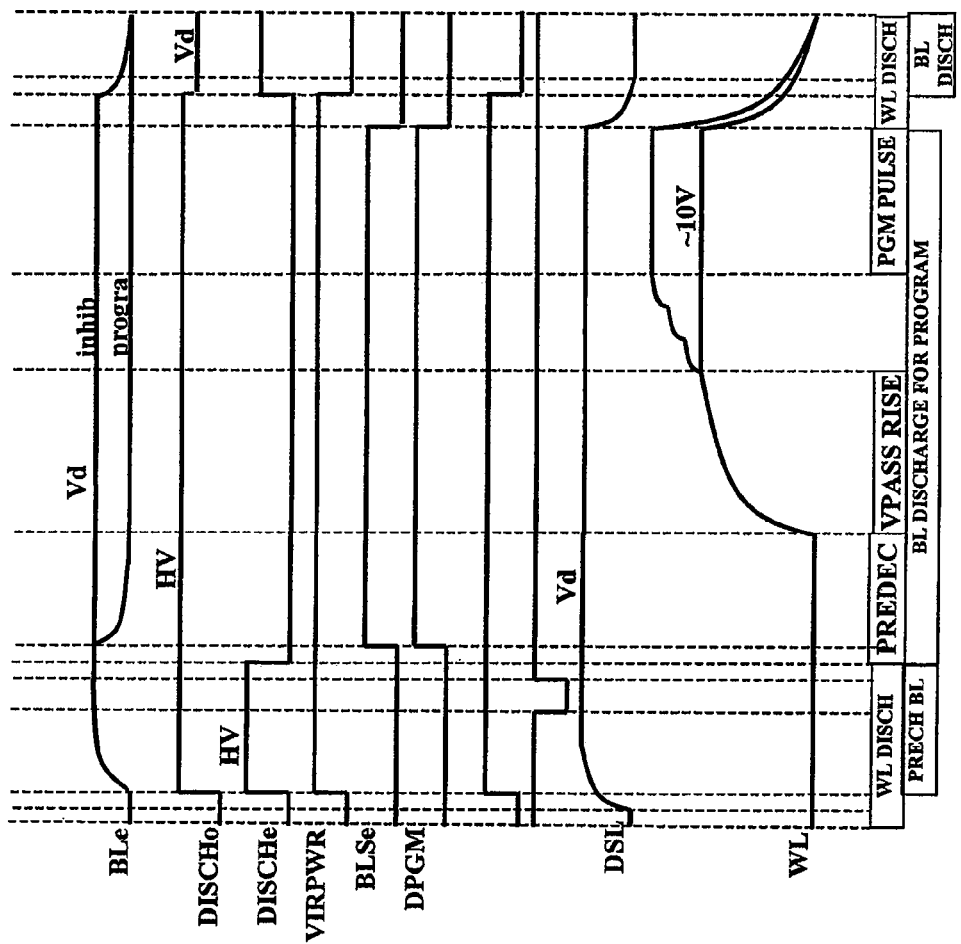
FIG. 10 illustrates the timing of a program operation for programming the LSB of the memory cells of a memory page of the NAND memory.
Figure 11:
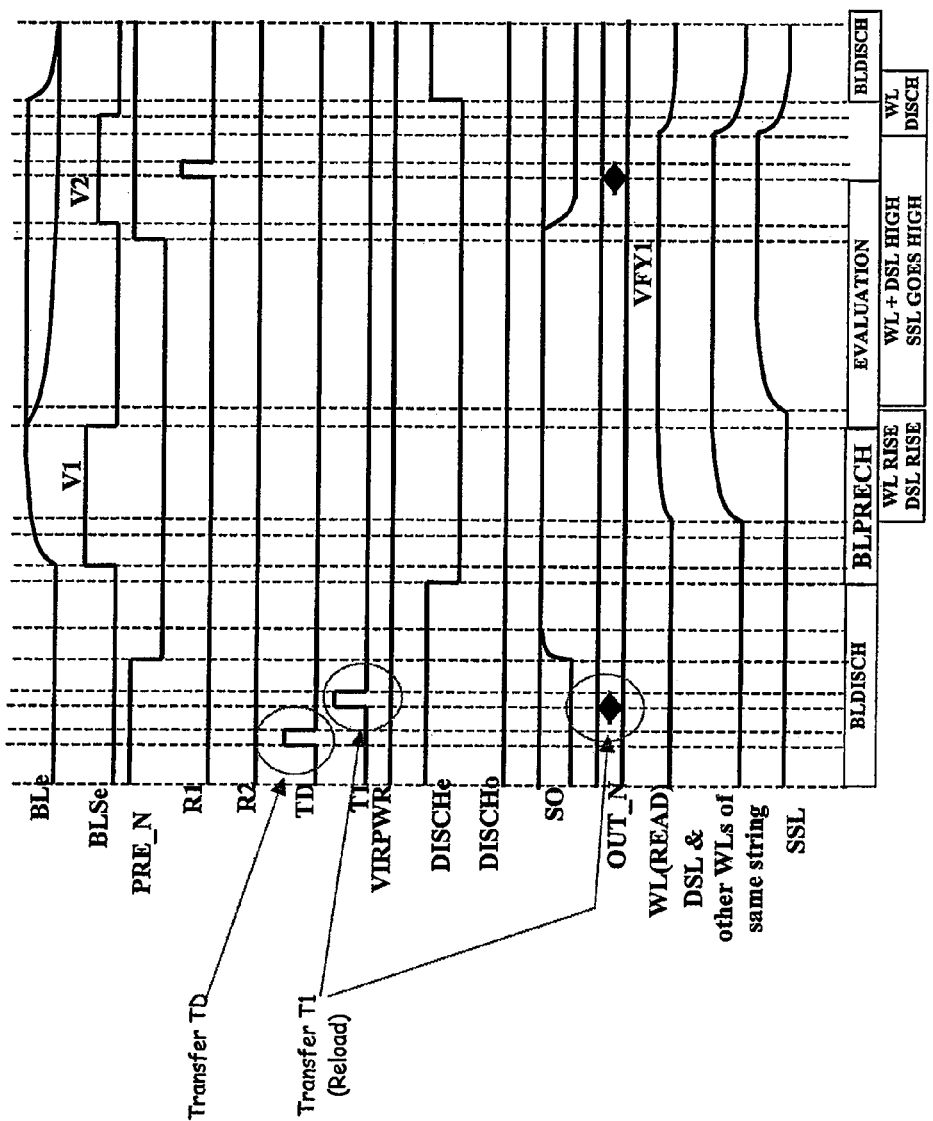
FIG. 11 illustrates the timing of an LSB program verify operation.

The diagrams in FIGS. 10 and 11 show the timing of some signals that are involved in the memory device during an LSB program operation and in the corresponding program verify operation.

MSB Program Operation

The MSB program operation is performed on memory cells wherein the LSB is assumed to have been previously programmed.

Similarly to the LSB program operation, also in an MSB program operation a dataload is first performed to load the data to be written into the read/write units 705 of the page buffer 130. This is accomplished in a way similar to that described above in respect of the LSB program operation.

The first, second and fourth latches L1, L2 and L4 are then reset, by asserting the signal PRE_N low and the signals L_SET and VSET high.

Before starting the application of programming pulses, an LSB read operation is then performed, biasing the selected word line to the reading voltage VREAD1, in order to assess in which of the two distributions 201 or 202 the threshold voltage of the selected memory cell fall; this assessment is necessary in order to determine which is the target distribution that the threshold voltage of the memory cell shall reach.

After the LSB read operation, the first latch L1 contains the information about the current value of the LSB stored in the selected memory cell, whereas the third latch L3 contains the information about the target value for the MSB to be stored into the memory cell. The two indications are combined to derive the information of whether the memory cell has to receive programming pulses or not. This accomplished by means of a number of transfer operations between the four latches L1 to L4. In particular, a transfer T3 operation is first performed, by asserting high the signal T3, so as to transfer into the fourth latch L4 the content of the first latch L1. The first latch L1 is then reset, by asserting the signal PRE_N low and the signal R1 high. A transfer T1 operation follows, asserting the signal T1 high, so as to transfer the content of the third latch L3 into the first latch L1. By means of a transfer TD operation, asserting the signal TD high, the content of the first latch L1 is then transferred into the second latch L2. A transfer T3 operation, asserting the signal T3 high, allows transferring the content of the first latch L1 into the fourth latch L4. Finally, a transfer T4 operation, asserting the signal T4, causes the content of the third latch L3 to be combined with the content of the fourth latch L4. At the end of this sequence of transfer operations, the state of the nodes of the read/write unit 705 is the following:

- the node M is at "1" if and only if the threshold voltage of the memory cell is to be brought into the third distribution 203;
- the node L is at "1" if and only if the threshold voltage of the memory cell is to be brought into the fourth distribution 204;
- the nodes L and M are both at "0" if and only if the memory cell does need to receive programming pulses;
- the nodes OUT and V1 are at "1" if the memory cell does not need to receive programming pulses, whereas these two nodes are at "0" is the memory cell needs to receive programming pulses.

In other words, if M=L="0", the target threshold voltage of the memory cell falls in the first distribution 201 or in the second distribution 202, and in both cases the memory cell does not need to receive programming pulses (it has already been brought to the target programming state during the LSB program operation); if M="1" and L="0", the target threshold voltage of the memory cell falls in the third distribution, and the memory cell needs to receive programming pulses; if M="0" and L="1", the target threshold voltage of the memory cell falls in the fourth distribution, and the memory cell needs to receive programming pulses.

The programming phase can now start. As described in the foregoing in connection with the LSB program operation, the bit line is precharged to the supply voltage Vdd; the signal DPGM is then asserted high, so that if the output of the NOR gate N1 is "0", the bit line is discharged to ground; this occurs if at least one of the nodes OUT_N and V1 is at "1"; if both these nodes are at "0", the bit line remains charged at the supply voltage Vdd, which prevents the memory cell from receiving the programming voltage.

The programming pulse is then applied to the selected word line, and to the memory cells that need to receive it.

Similarly to the LSB program operation described in the foregoing, after each programming pulse a program verify operation is performed, for assessing whether the selected memory cell has reached the target programming state. Before performing the program verify operation a transfer TD operation is accomplished by asserting the signal TD high, so as to transfer the content of the first latch L1 into the second latch L2; then, a transfer T1 operation is performed, asserting the signal T1, so as to re-load the original datum (still available in the third latch L3) into the first latch L1.

A first program verify operation is then conducted, biasing the selected word line to the verify voltage VFY2; if the threshold voltage of the memory cell under programming has reached the third distribution 203, the cell does not sink current, and the node OUT switches to "1", otherwise the node OUT remains at "0". However, this verify operation alone is not sufficient to assess that a memory cell having a target threshold voltage in the fourth distribution 204 has reached the target programming state; the initial conditions are then restored, thanks to the information stored in the fourth latch L4: by means of a transfer T2 operation, asserting the signal T2 high, the node OUT is brought back to "0" only if the target programming state corresponds to the fourth threshold voltages distribution 204 (otherwise, the node OUT remains at "1"). A second verify operation is then conducted, biasing the selected word line at the verify voltage VFY3: if the memory cell has reached the fourth distribution 204, it does not sink current, and the node OUT switches again to "1", otherwise it remains at "0".

Irrespective of the fact that, in consequence of the two verify operations at the voltages VFY2 and VFY3, the node OUT has switched to "1" or not, thanks to the fact that the node V1 is at "1" the memory cell, even if already verified as programmed to the target programming state, receives the next programming pulse, i.e., it receives an extra programming pulse.

After the next programming pulse, the transfer TD operation forces the node V1 to "0", and in this way the second latch L2 does no longer affect the output of the NOR gate N1: thus, only the outcome of the successive verify operations determine whether the memory cell has to receive the next programming pulses or not.

As in the case of the LSB program operation, since the first latch L1 is always re-loaded (transfer T1 and transfer T2 operations) with the original datum before performing a program verify operation, the memory cell continues to be verified even if it has already been verified as programmed to the target programming state. Due to this, it is possible that a memory cell, previously verified as programmed to the target state, during a successive program verify operation is not verified as programmed: if this happens, the memory cell receives the programming pulse following the failed verify operation. However, this is quite unlikely, because the extra programming pulse that the memory cell received after having been verified as programmed should guarantee a sufficient margin.

The above operations are iterated until the second latch L2 in all the read/write units 705 has been reset, i.e., the node V1 has been brought to "0": when this happens, the transistors M9 in all the read/write units 705 are off, so the node VER_N, which is the output of the wired-NAND, falls to ground. This indicates the completion of the MSB program operation It can be appreciated that, apart from the initial transfer operations after the dataload, a difference between the LSB program operation and the MSB program operation resides in the additional transfer T2 operation and read operation at the verify voltage VFY3 necessary for verifying the cells whose target programming state is "01" (fourth distribution 204)

Figure 12:
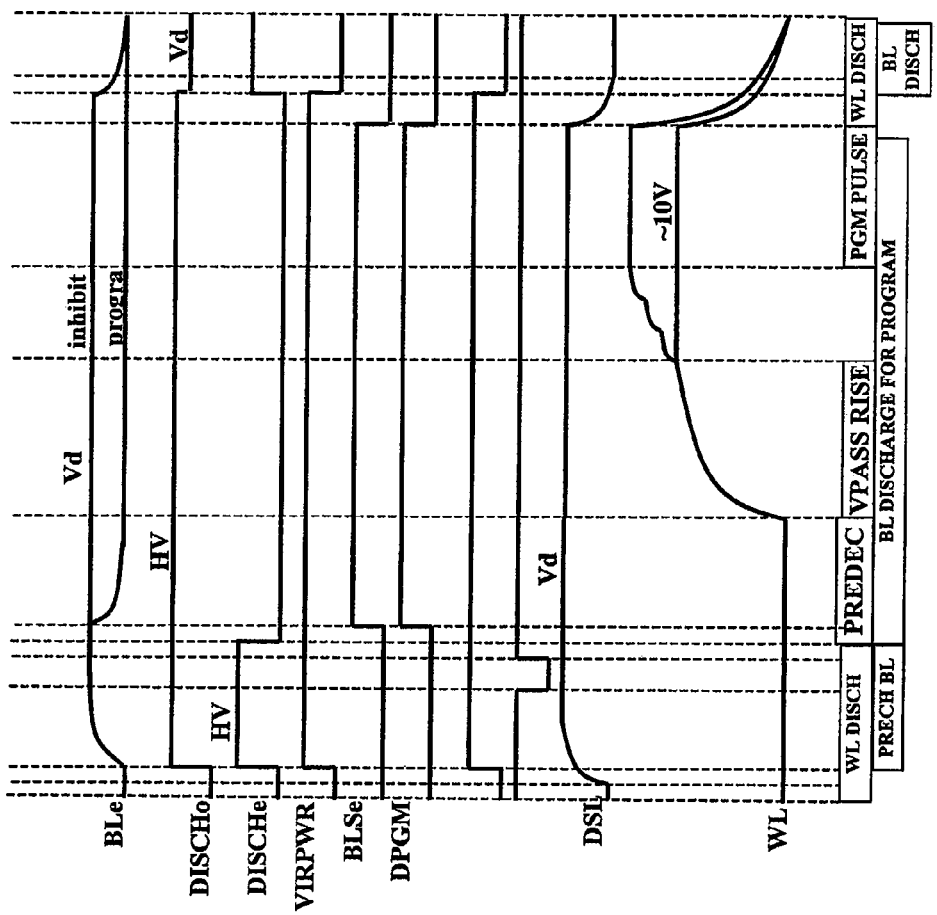
FIG. 12 illustrates the timing of a program operation for programming the MSB of the memory cells of a memory page of the NAND memory.
Figure 13:
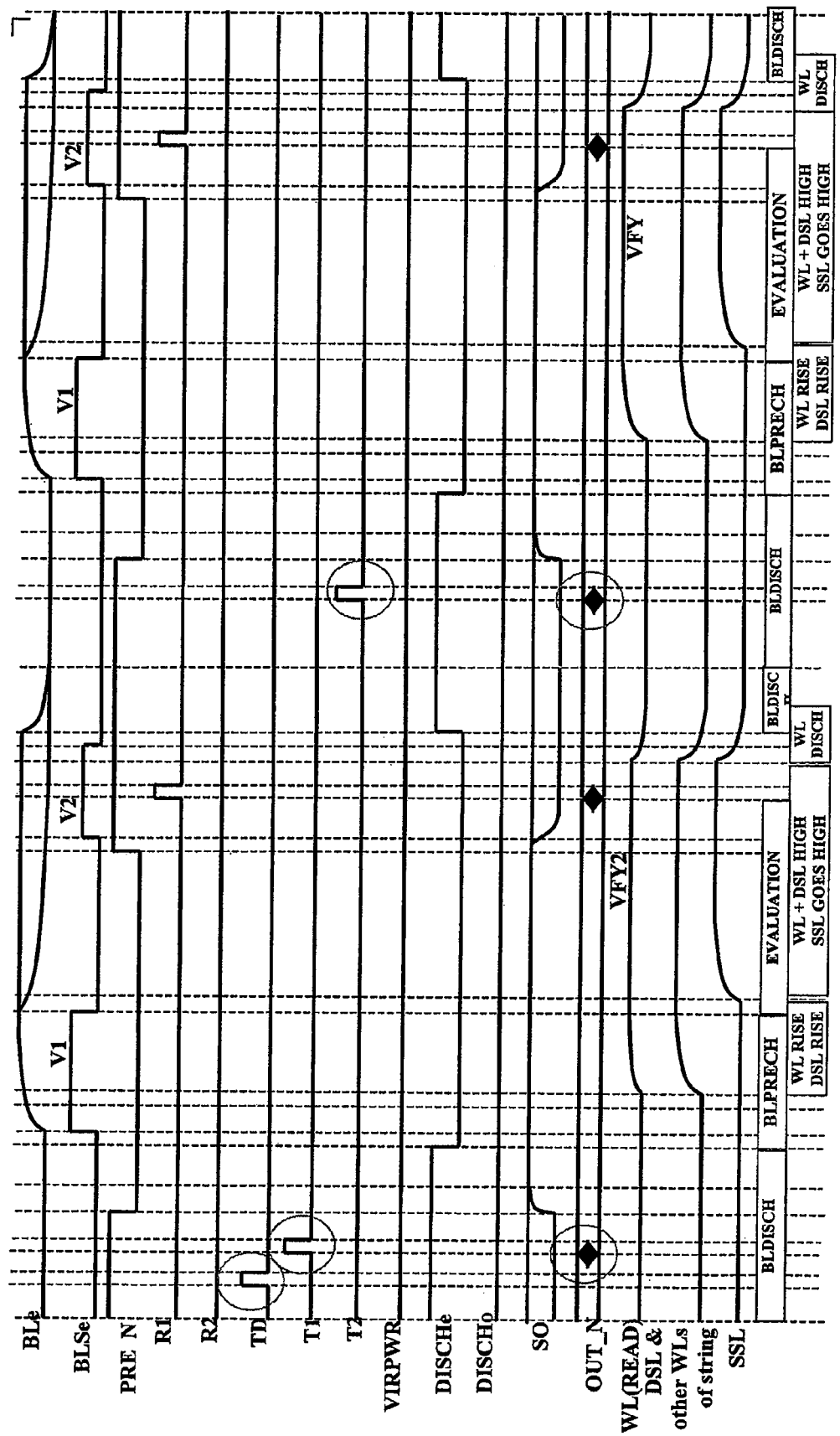
FIG. 13 illustrates the timing of an MSB program verify operation.

The diagrams in FIGS. 12 and 13 show the timing of some signals that are involved in the memory device during an LSB program operation and a corresponding verify operation.

Erase

The erase operation is intended to remove the electric charge from the floating gates of the memory cells to be erased, so as to bring their threshold voltage into the first distribution 201 (corresponding to the state "11"). This is accomplished by applying erase pulses to the memory cells to be erased. The page buffer 130 is exploited to verify whether the cells, after each erase pulse, have reached the target, erased state.

In order to verify whether the memory cells have attained the erased condition, it is necessary to consider whether a bit line has been functionally replaced by a redundant bit line (i.e., if the bit line has been "redunded"): since it may happen that the memory cells belonging to a redunded bit line cannot be erased, the erase verify operation would never succeed unless these memory cells are somehow excluded or not taken into account in the erase verify operation. Thus, the page buffer has to be forced to consider as verified the memory cells belonging to redunded bit lines. The second latch L2 is used for this purpose: in the case of a redunded bit line, the second latch L2 is set so as to turn the transistor M9 on.

Initially, the first latch L1 and the third latch L3 are reset, bringing the nodes OUT and M to "1". The second latch L2 is set by asserting the signal VSET high, and the fourth latch L4 is set.

If the selected bit line is redunded, the node M is set to "0", whereas if the bit line is not redunded, the node M remains at "1": this is accomplished by means of a dataload operation, properly setting the signals D and D_N.

The information that the bit line is or not redunded is temporarily transferred into the second latch L2, with a transfer T2 operation; then, the information is transferred from the second latch L2 into the third latch L3 by means of a transfer TD operation: as a result, if the bit line is redunded the gate of the transistor M9 is forced to ground, otherwise it is at the supply voltage Vdd.

The first latch L1 is then prepared for the erase verify operation, setting the node OUT to "1" (asserting the signal PRE_N low and the signal R1 high).

Typically, the erase pulse is applied to an entire group of memory cells including all the memory cells connected to all the word lines of a stack.

After applying the erase pulse, the erase verify operation is performed: this involves performing a read operation, conducted biasing all the word lines of the stack to ground. Thus, all the memory cells of a stack are verified at a time.

If all the cells of the stack have been erased, the current flowing through them discharges the bit line, and thus the node SO; the node OUT remains at "1". If even a single one of the memory cells of the stack has not been erased, this cell does not sink current, so that the bit line, and consequently the node SO, cannot be discharged to ground. The node SO remains at the supply voltage Vdd, and the node OUT is brought to ground.

In an embodiment of the invention, both the bit lines Ble and Blo are selected in succession, without setting the node OUT to "1" between the two readings; in this way, the node OUT remains at "1" only if the memory cells of the stacks connected to both the bit line BLe and the bit line Blo have been erase.

A transfer TD operation is then performed, to transfer the information from the first latch L1 to the second latch L2; as mentioned above, if the bit line is redunded the gate of the transistor M9 has already been set to "1", and the transfer TD does not change this setting; if instead the bit line is not redunded, the gate of the transistor T9 has been set to "0"; in this case, if the erase verify succeeded (node OUT at "1"), the transfer TD operation brings the gate of the transistor M9 to "1", thereby turning it on; if instead the verify operation did not succeed (node OUT at "0"), the transfer TD operation leaves the gate of the transistor M9 at ground. The erase phase terminates successfully when the transistor M9 in all the read/write units 305 turns on, and the output VER_N of the wired-NAND goes to ground.

The distribution of threshold voltages that is obtained performing the erase operation previously described may be too broad, and this may have a negative impact on the time required for the subsequent program operations on the memory cells belonging to the erased block. For example, an erased memory cell having a too low threshold voltage needs more programming pulses than an erased memory cell having a higher threshold voltage.

For this reason, after the erase operation a soft programming or SOft Compression (SOC) operation is performed, adapted to make the distribution of threshold voltages of the erased memory cells more compact.

The operations for performing a SOC are similar to those for performing the erase verify operations, but instead of applying the erase pulse, a light programming pulse is applied to the memory cells. A verify operation similar to the erase verify operation described above is performed after applying the light programming pulse, biasing all the word lines at ground. A transfer TD operation is then performed, by asserting the signal TD. The operations are iterated until at least one memory cell is no longer verified as erased (at each iteration, a slightly higher programming pulse is applied). A final verify operation is performed, biasing all the word lines at a voltage slightly higher than the ground, adapted to assess that the SOC operation has not shifted the distribution of the threshold voltages for the erased memory cells to too high values.

Thus, one embodiment of the present invention sets forth a method of programming electrically programmable memory cells, particularly non-volatile memory cells, which, differently from the conventional programming methods, does not inhibit the execution of program verify operations on memory cells that have already been assessed to have reached the target programming state: every memory cell in a group of memory cells under programming continues to be subject to program verify operations as the program operation proceeds, until all the memory cells are assessed as programmed to the respective target programming state.

In particular, according to a preferred embodiment of the invention, the first time a memory cell is verified as programmed to the target programming state, an extra programming pulse is always applied thereto; afterwards, provided the memory cell continues to be verified as programmed to the target programming state, it is excluded from the application of further programming pulses.

The application of the extra programming pulses ensures that the memory cell is programmed with a sufficient security margin, so that is very unlikely that, in the prosecution of the programming operation, that memory cell may not pass the program verify. However, if in the following of the program operation it happens that the memory cell fails a program verify, it is again applied programming pulses.

The present invention has been here described considering some exemplary embodiments therein. Those skilled in the art will appreciate that several modifications to the described embodiments, as well as other embodiments the invention are possible, for example for satisfying contingent needs, without departing from the scope of the invention defined in the appended claims.

For example, the number of extra programming pulses that are applied to a memory cell right after verifying it as programmed may be higher than one; this may depend on the threshold voltage shift imparted by the single programming pulse, as well as on the separation between the threshold voltage distributions that correspond to the different programming states.

The invention claimed is:

1. A method of electrically programming a memory cell, the method comprising:
    applying at least one electrical programming pulse to the memory cell;
    verifying whether a target programming state has been reached by the memory cell;
    repeating said applying and verifying until verifying that said target programming state has been reached by the memory cell; and
    after verifying that the target programming state has been reached by the memory cell, applying at least one further electrical programming pulse to the memory cell.

2. The method of claim 1, further comprising:
    further verifying that the target programming state has been reached by the memory cell at least one more time after applying the further programming pulse.

3. The method of claim 2, further comprising:
    in case, as a result of said further verifying, the target programming state is not reached by the memory cell, applying a still further programming pulse to the memory cell.

4. The method of claim 3, wherein the memory cell is part of a group of memory cells to be programmed in parallel, and wherein said applying at least one electrical programming pulse, verifying whether the target programming state has been reached and repeating said applying and verifying until the target programming state has been reached are performed on all the memory cells of the group to be programmed, said acts of applying at least one further electrical programming pulse to the memory cell and further verifying the memory cell being performed simultaneously to applying at least one electrical programming pulse to at least one further memory cell of the group and, respectively, verifying whether the at least one further memory cell of the group has reached a respective target programming state.

5. The method of claim 4, wherein said applying a still further programming pulse to the memory cell is performed simultaneously to the operation of applying at least one electrical programming pulse to at least one further memory cell of the group.

6. The method of claim 1, further comprising:
    latching a datum corresponding to the target programming state in a first latch, wherein applying the at least one electrical programming pulse includes selectively applying to the memory cell the at least one electrical programming pulse responsive to a value of the first latch;
    preserving the value of the first latch in a second latch; and
    modifying the value of the first latch in response to verifying that the target programming state has been reached by the memory cell;
    storing in a third latch an indication of whether the target programming state has been reached by the memory cell, wherein selectively applying the at least one electrical programming pulse to the memory cell being further responsive to a value of the third latch.

7. The method of claim 6, wherein the memory cell is structured to store a data word including at least two data bits, said at least two data bits including a first data bit group and a second data bit group, the method further comprising:
    assessing a value of the first data bit group stored in the memory cell;
    storing in the first latch a value corresponding to the assessed value of the first data bit group;
    combining the value stored in the second latch and the value stored in the first latch, so as to obtain a combined value, said combined value defining the target programming state for the memory cell;

transferring said combined value into said first latch.

8. A programming circuit for electrically programming a memory cell, comprising:

means for causing an application of an electrical programming pulse to the memory cell depending on a target programming state to be reached by the memory cell; and means for verifying a reaching of the target programming state by the memory, wherein:

said means for causing the application of the electrical programming pulse cause an application of at least one further programming pulse after said means for verifying have verified the reaching of the target programming state by the memory cell.

9. The programming circuit of claim 8, wherein:

said means for verifying further verify the reaching of the target programming state by the memory cell at least one more time after said application of the at least one further programming pulse; and said means for causing the application of the electrical programming pulse cause a still further programming pulse to the memory cell in case, as a result of said further verify, the reaching of the target programming state by the memory cell is not assessed.

10. The programming circuit of claim 9, including:

a first latch structured to latch a datum corresponding to the target programming state, the datum of the first latch being modified by said means for verifying after verifying the reaching of the target programming state by the memory cell, wherein the means for causing is responsive to the datum of the first latch;

a second latch operatively coupled to the first latch and structured to preserve said datum corresponding to the target programming state; and a third latch operatively coupled to the first latch and structured to store an indication of the reaching of the target programming state by the memory cell, said means for causing being further responsive to a content of the third latch.

11. The programming circuit of claim 10, wherein the memory cell is structured to store a data word including at least two data bits, said at least two data bits including a first data bit group and a second data bit group, the programming circuit further comprising:

a memory cell reading circuit structured to assess a value of the first data bit group stored in the memory cell, and to store in the first latch a value corresponding to the assessed value of the first data bit group;

means, operatively coupled to said first latch and to said second latch, for combining the value stored in the second latch and the value stored in the first latch so as to obtain a combined value, said combined value defining the target programming state for the memory cell;

means for transferring said combined value into said first latch.

12. The programming circuit of claim 11, wherein said means operatively coupled to said first latch and to said second latch comprises a fourth latch.

13. An electrically-programmable semiconductor memory, comprising:

a plurality of memory cells; and a programming circuit for electrically programming selected memory cells of said plurality, said programming circuit including:

means for causing an application of an electrical programming pulse to the memory cell depending on a target programming state to be reached by the memory cell; and means for verifying a reaching of the target programming state by the memory, wherein:

said means for causing the application of the electrical programming pulse cause an application of at least one further programming pulse after said means for verifying have verified the reaching of the target programming state by the memory cell.

14. The electrically-programmable semiconductor memory of claim 13, wherein said plurality of memory cells includes a NAND arrangement of the memory cells, with the memory cells being grouped in memory pages, and said programming circuit is included in a page buffer for reading/programming said memory pages.

15. The electrically-programmable semiconductor memory of claim 13, wherein:

said means for verifying further verify the reaching of the target programming state by the memory cell at least one more time after said application of the at least one further programming pulse; and said means for causing the application of the electrical programming pulse cause a still further programming pulse to the memory cell in case, as a result of said further verify, the reaching of the target programming state by the memory cell is not assessed.

16. The electrically-programmable semiconductor memory of claim 15, wherein the programming circuit includes:

a first latch structured to latch a datum corresponding to the target programming state, the datum of the first latch being modified by said means for verifying after verifying the reaching of the target programming state by the memory cell, wherein the means for causing is responsive to the datum of the first latch;

a second latch operatively coupled to the first latch and structured to preserve said datum corresponding to the target programming state; and a third latch operatively coupled to the first latch and structured to store an indication of the reaching of the target programming state by the memory cell, said means for causing being further responsive to a content of the third latch.

17. The electrically-programmable semiconductor memory of claim 16, wherein the memory cells are structured to store a data word including at least two data bits, said at least two data bits including a first data bit group and a second data bit group, the programming circuit further comprising:

a memory cell reading circuit structured to assess a value of the first data bit group stored in a selected memory cell, and to store in the first latch a value corresponding to the assessed value of the first data bit group;

means, operatively coupled to said first latch and to said second latch, for combining the value stored in the second latch and the value stored in the first latch so as to obtain a combined value, said combined value defining the target programming state for the selected memory cell;

means for transferring said combined value into said first latch.

18. The electrically-programmable semiconductor memory of claim 17, wherein said means operatively coupled to said first latch and to said second latch comprises a fourth latch.

* * * * *